(12) United States Patent
More et al.

(10) Patent No.: US 12,336,266 B2
(45) Date of Patent: Jun. 17, 2025

(54) METHODS OF FORMING GATE STRUCTURES WITH UNIFORM GATE LENGTH

(71) Applicant: Taiwan Semiconductor Manufacturing Co., Ltd., Hsinchu (TW)

(72) Inventors: Shahaji B. More, Hsinchu (TW); Cheng-Han Lee, New Taipei (TW); Shih-Chieh Chang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 75 days.

(21) Appl. No.: 17/226,905

(22) Filed: Apr. 9, 2021

(65) Prior Publication Data

US 2022/0149176 A1 May 12, 2022

Related U.S. Application Data

(60) Provisional application No. 63/112,758, filed on Nov. 12, 2020.

(51) Int. Cl.

| H10D 64/66 | (2025.01) |
| H01L 21/02 | (2006.01) |
| H01L 21/306 | (2006.01) |
| H10D 30/01 | (2025.01) |
| H10D 30/67 | (2025.01) |

(Continued)

(52) U.S. Cl.
CPC ..... *H10D 64/671* (2025.01); *H01L 21/02603* (2013.01); *H01L 21/30604* (2013.01); *H10D 30/031* (2025.01); *H10D 30/6713* (2025.01); *H10D 30/6735* (2025.01); *H10D 30/6757* (2025.01); *H10D 62/021* (2025.01); *H10D 62/121* (2025.01); *H10D 64/018* (2025.01); *H10D 84/85* (2025.01)

(58) Field of Classification Search
CPC ........... H01L 29/4983; H01L 21/02603; H01L 21/30604; H01L 27/092; H01L 29/0673; H01L 29/42392; H01L 29/66553; H01L 29/66636; H01L 29/66742
See application file for complete search history.

(56) References Cited

U.S. PATENT DOCUMENTS 7,227,176 B2 *  6/2007  Wu ................... H01L 21/76256
257/190
9,209,247 B2    12/2015  Colinge et al.
(Continued)

FOREIGN PATENT DOCUMENTS

TW      201913821 A    4/2019
TW      201914950 A    4/2019
(Continued)

*Primary Examiner* — Thao X Le
*Assistant Examiner* — Sean Ayers Winters
(74) *Attorney, Agent, or Firm* — Slater Matsil, LLP

(57) ABSTRACT

A device includes a first gate region having a first gate length; a first spacer on a sidewall of the first gate region; a semiconductor layer over the first gate region; a second gate region over the semiconductor layer, wherein the second gate region has a second gate length equal to the first gate length; and a second spacer on a sidewall of second gate region, wherein the second spacer is wider than the first spacer.

18 Claims, 31 Drawing Sheets

(51) Int. Cl.
  *H10D 62/00* (2025.01)
  *H10D 62/10* (2025.01)
  *H10D 64/01* (2025.01)
  *H10D 84/85* (2025.01)

(56) References Cited

U.S. PATENT DOCUMENTS

| | | | |
|---|---|---|---|
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,283,516 B1* | 5/2019 | Reznicek | H10B 41/30 |
| 10,297,664 B2 | 5/2019 | Xie | |
| 2008/0050883 A1* | 2/2008 | Enicks | H01L 29/161 257/E29.247 |
| 2008/0135878 A1* | 6/2008 | Kim | H01L 29/78 257/E21.409 |
| 2016/0111537 A1* | 4/2016 | Tsai | H01L 21/324 257/192 |
| 2018/0212038 A1* | 7/2018 | Chao | H01L 29/66545 |
| 2018/0301531 A1* | 10/2018 | Xie | H01L 21/02532 |
| 2019/0058051 A1* | 2/2019 | Kim | H01L 29/42392 |
| 2019/0081155 A1 | 3/2019 | Xie et al. | |
| 2019/0088797 A1* | 3/2019 | Chen | H01L 29/42392 |
| 2019/0148515 A1 | 5/2019 | Cheng et al. | |
| 2019/0157420 A1 | 5/2019 | Cheng et al. | |
| 2019/0187097 A1* | 6/2019 | Li | B82B 3/0019 |
| 2019/0296127 A1* | 9/2019 | Cheng | H01L 29/78618 |
| 2019/0341469 A1 | 11/2019 | Cheng et al. | |
| 2019/0393102 A1 | 12/2019 | Chiang et al. | |
| 2020/0006559 A1* | 1/2020 | Mehandru | H01L 29/6653 |
| 2020/0044087 A1* | 2/2020 | Guha | H01L 29/66439 |
| 2020/0052086 A1* | 2/2020 | Yang | H01L 29/4991 |
| 2020/0052132 A1* | 2/2020 | Ching | H01L 29/0673 |
| 2020/0058653 A1* | 2/2020 | Chiang | H01L 29/24 |
| 2020/0075716 A1 | 3/2020 | Wang et al. | |
| 2020/0075718 A1 | 3/2020 | Wang et al. | |
| 2020/0220018 A1* | 7/2020 | Jang | H01L 29/0847 |
| 2021/0202527 A1 | 7/2021 | Kim et al. | |

FOREIGN PATENT DOCUMENTS

| | | |
|---|---|---|
| TW | 202008595 A | 2/2020 |
| TW | 202010138 A | 3/2020 |

* cited by examiner

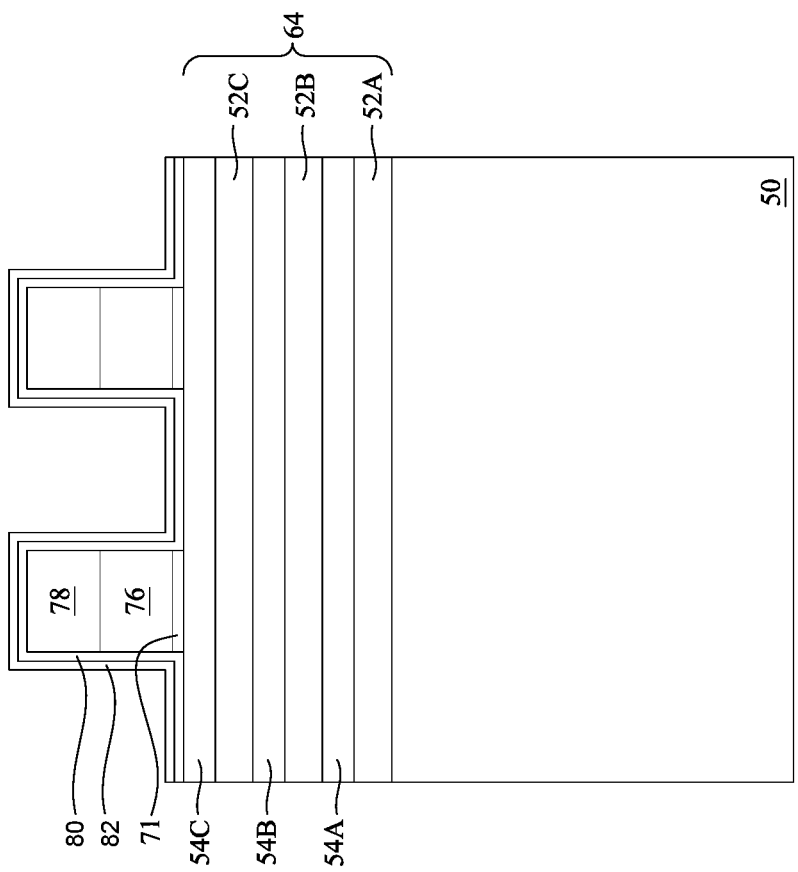
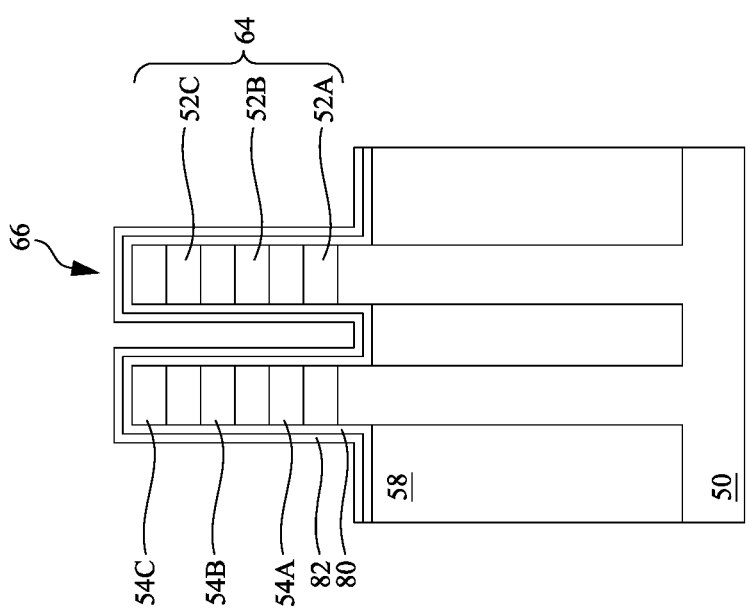
Fig. 7A
Fig. 7B

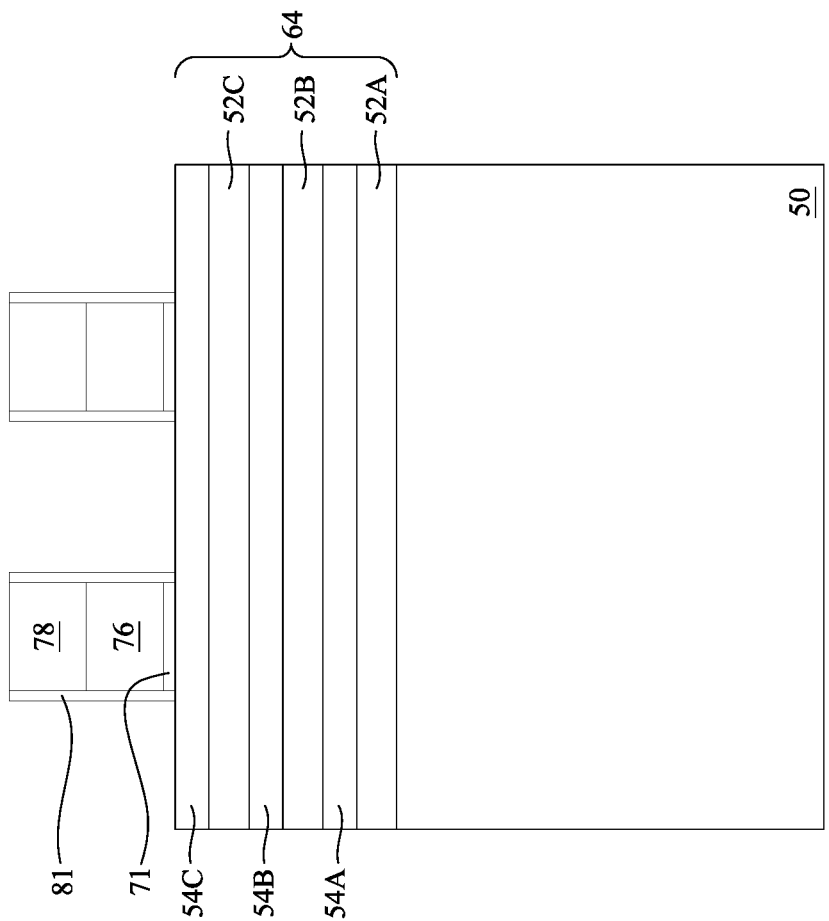
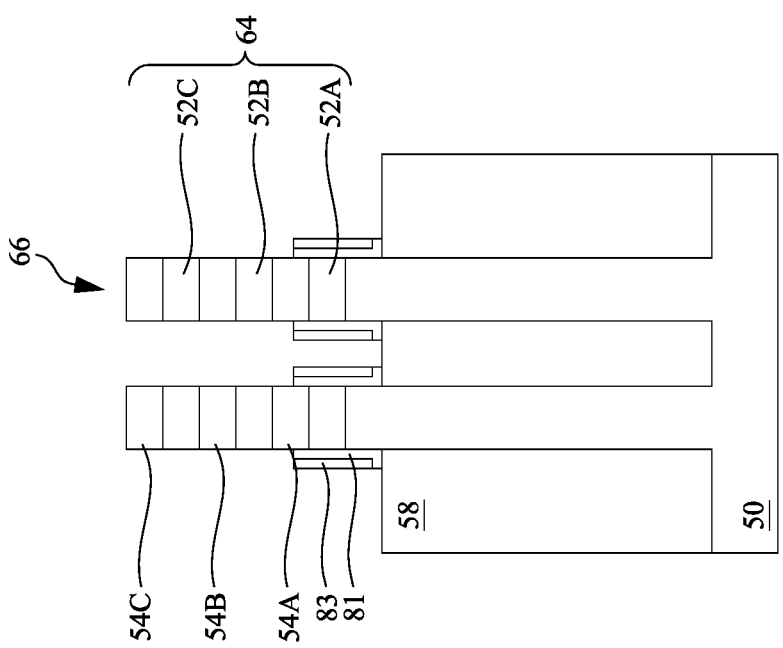
Fig. 8A
Fig. 8B

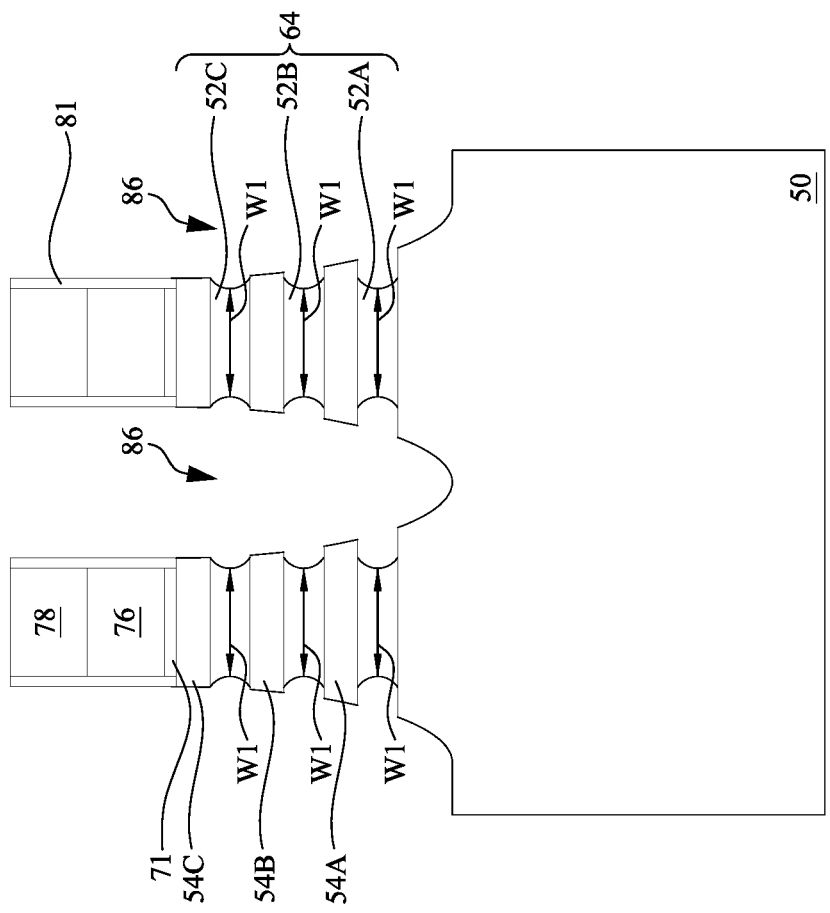
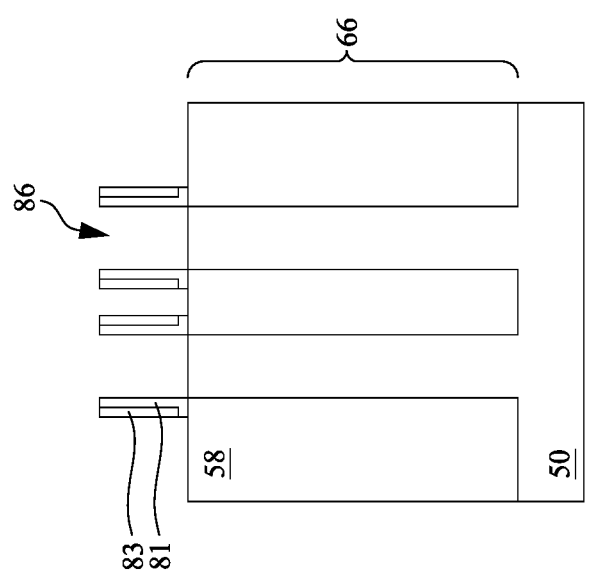
Fig. 10B
Fig. 10A

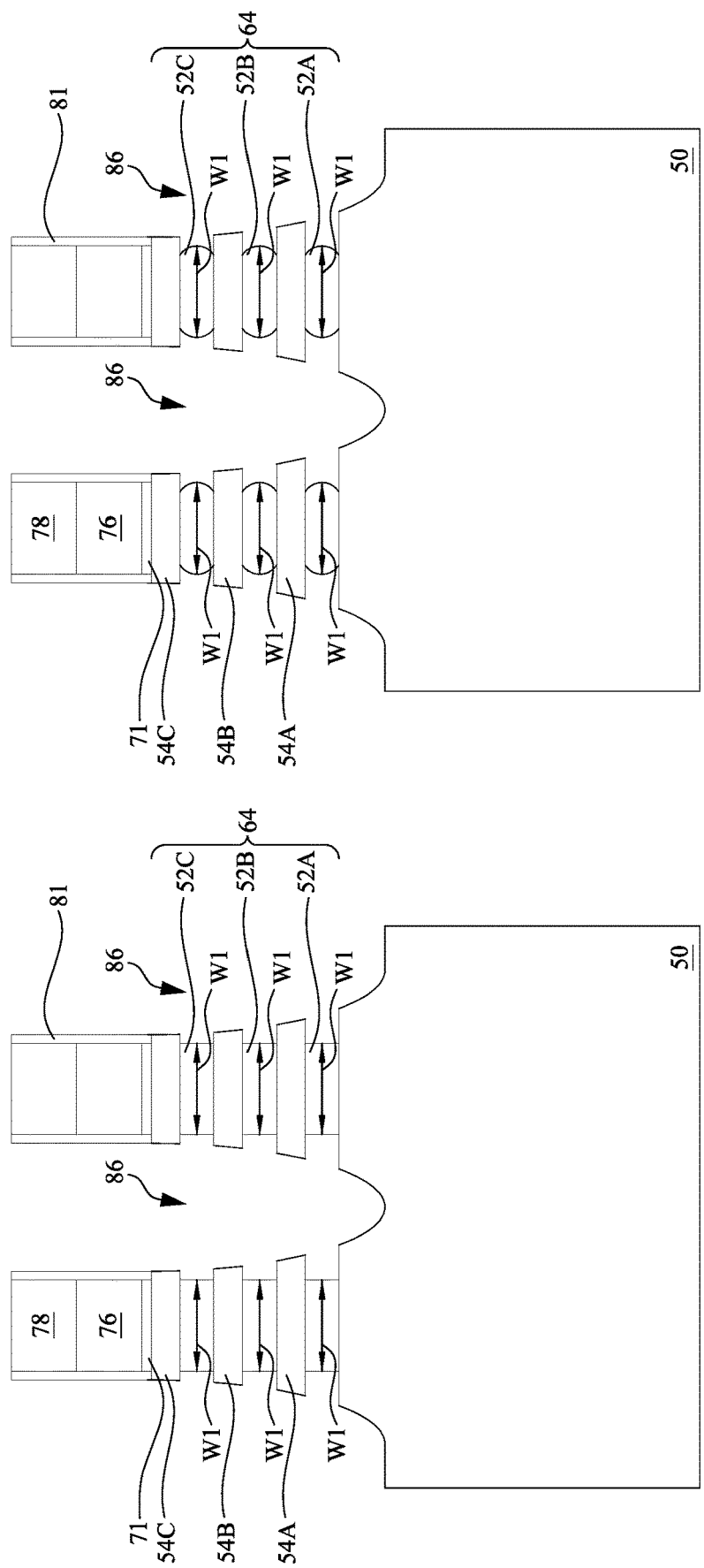

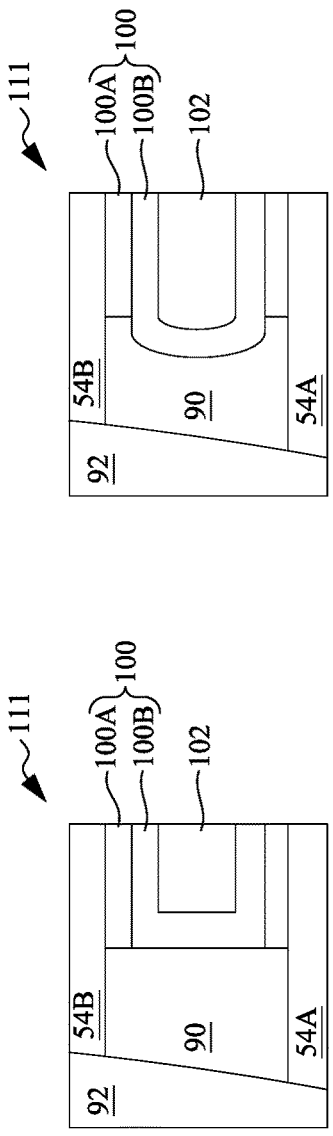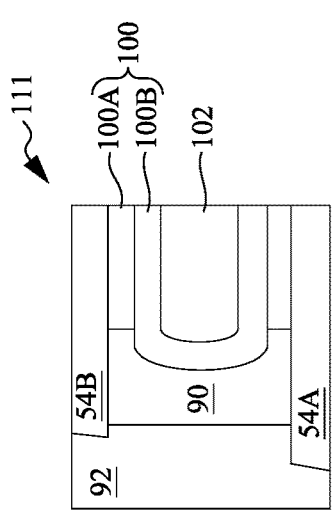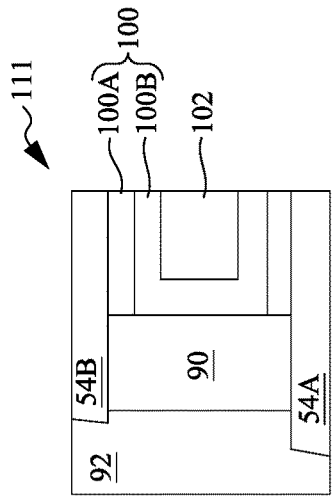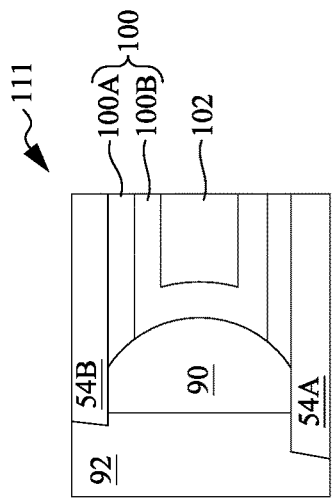

METHODS OF FORMING GATE STRUCTURES WITH UNIFORM GATE LENGTH

PRIORITY

This application claims the benefit of U.S. Provisional Application No. 63/112,758, filed on Nov. 12, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 2C, 2D, 2E, 3, 4, 5, 6A, 6B, 7A, 7B 8A, 8B, 9A, 9B, 10A, 10B, 10C, 10D, 11A, 11B, 12A, 12B, 12C, 13A, 13B, 13C, 14A, 14B, 15A, 15B, 16A, 16B, 17A, 17B, 17C, 17D, 17E, 17F, 17G, 17H, 18A, 18B, 18C, 19A, 19B, 19C, 20A, 20B, and 20C are cross-sectional views of intermediate stages in the manufacturing of transistors, in accordance with some embodiments.

DETAILED DESCRIPTION

Figure 1:
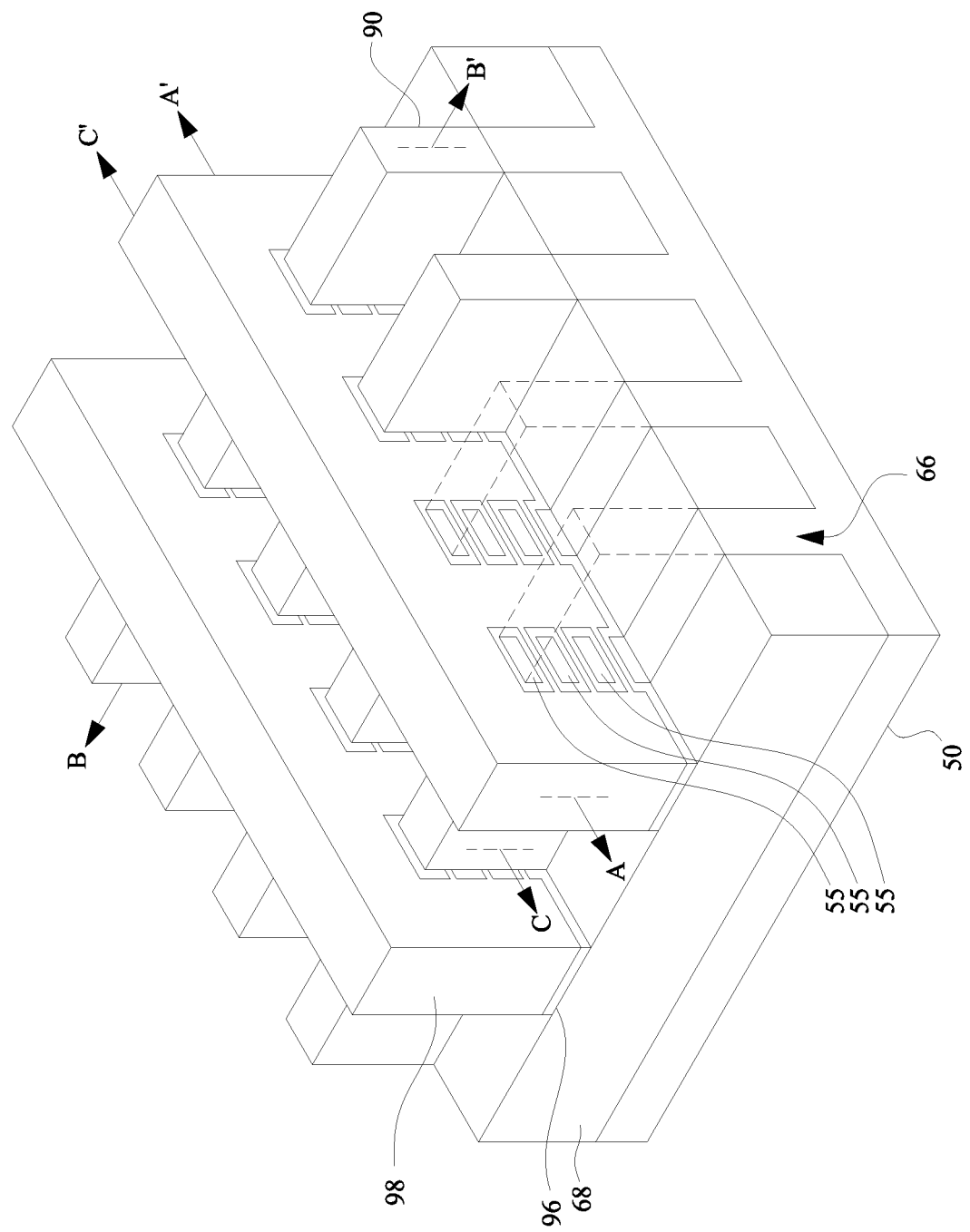
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments described herein provide nano-FETs (e.g., nanowire FETs, nanosheet FETs, gate all around (GAA) or the like). Each of the nano-FETs may include gate regions around a stack of channel regions having a relatively uniform gate length. The gate regions of the uniform length may be achieved, for example, by replacing sacrificial nanosheets disposed between the semiconductor nanosheets that subsequently provide the channel regions in the completed transistor. The sacrificial nanosheets may be deposited with varying concentrations of germanium such that each of the sacrificial nanosheets may be etched a different amount to compensate for a non-uniform, anisotropic etching processes used to pattern the sacrificial nanosheets. As a result, the profiles of the sacrificial nanosheets (and resulting gate regions) may be more precisely controlled to provide improved uniformity. Further, defects, such as silicon germanium residue after removal of the sacrificial nanosheets, may be avoided by doping the sacrificial nanosheets with a Group III element (e.g., boron or the like).

FIG. 1 illustrates an example of nano-FETs in a three-dimensional view, in accordance with some embodiments. The nano-FETs comprise nano-structures 55 (e.g., nanosheets, nanowire, or the like) over fins 66 on a substrate 50 (e.g., a semiconductor substrate), wherein the nano-structures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 96 are over top surfaces of the fins 66 and along top surfaces, sidewalls, and bottom surfaces of the nano-structures 55. Gate electrodes 98 are over the gate dielectric layers 96. Epitaxial source/drain regions 90 are disposed on the fins 66 on opposing sides of the gate dielectric layers 96 and the gate electrodes 98.

FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 90 of a nano-FET. Cross-section B-B' is perpendicular to cross-section A-A' and is parallel to a longitudinal axis of a fin 66 of the nano-FET and in a direction of, for example, a current flow between the epitaxial source/drain regions 90 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2A through 20C are cross-sectional views of intermediate stages in the manufacturing of nano-FETs, in accordance with some embodiments. FIGS. 2A through 5, 6A, 13A, 14A, 15A, 16A, 17A, 18A, 19A, and 20A illustrate reference cross-section A-A' illustrated in FIG. 1. FIGS. 6B, 7B, 8B, 9B, 10B, 10C, 10D 11B, 12B, 13B, 14B, 15B, 16B, 17B, 17C, 17D, 17E, 17F, 17G, 17H, 18B, 19B, and 20B illustrate reference cross-section B-B' illustrated in FIG. 1. FIGS. 7A, 8A, 9A, 10A, 11A, 12A, 12C, 13C, 18C, 19C, and 20C illustrate reference cross-section C-C' illustrated in FIG. 1.

Figure 2A:
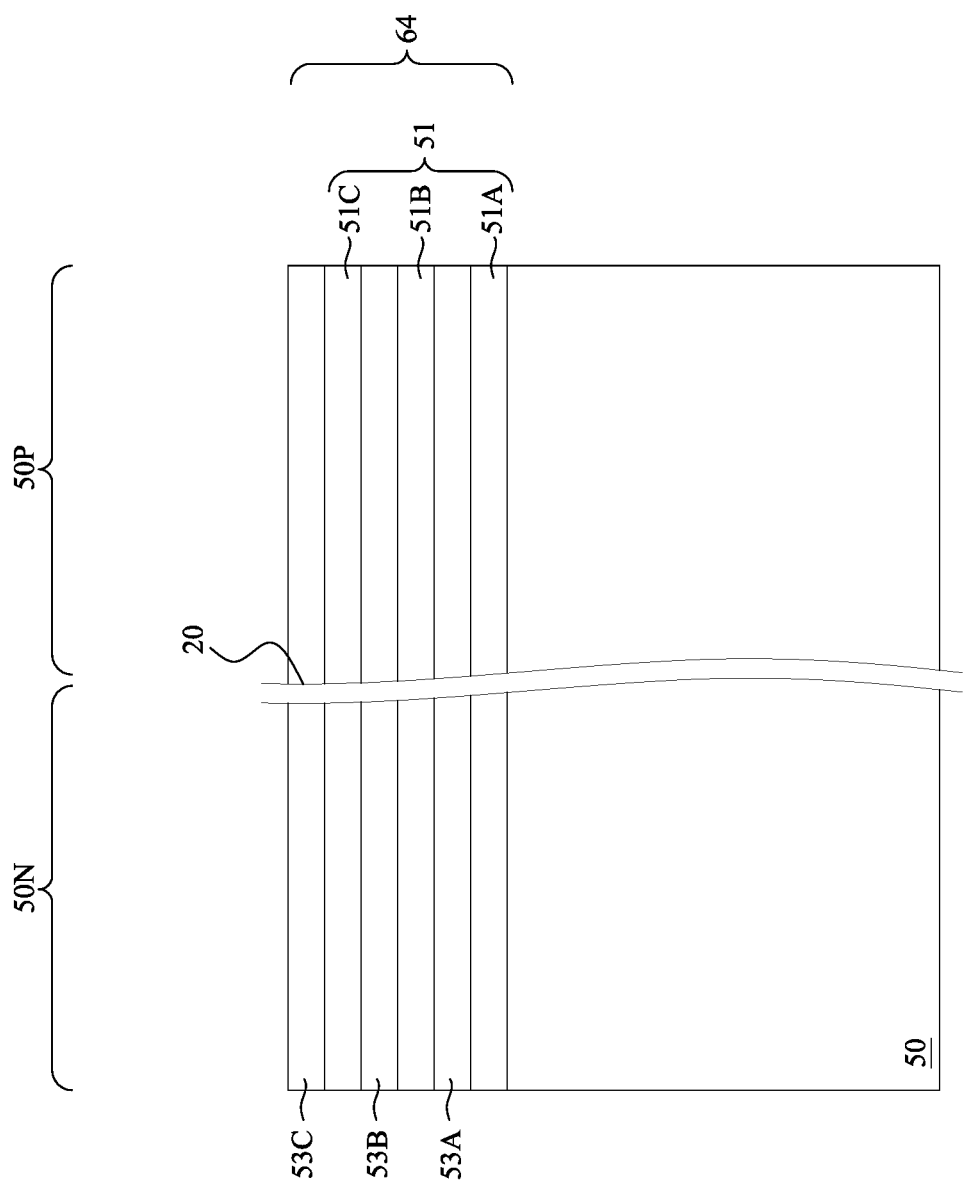
Figure 2B:
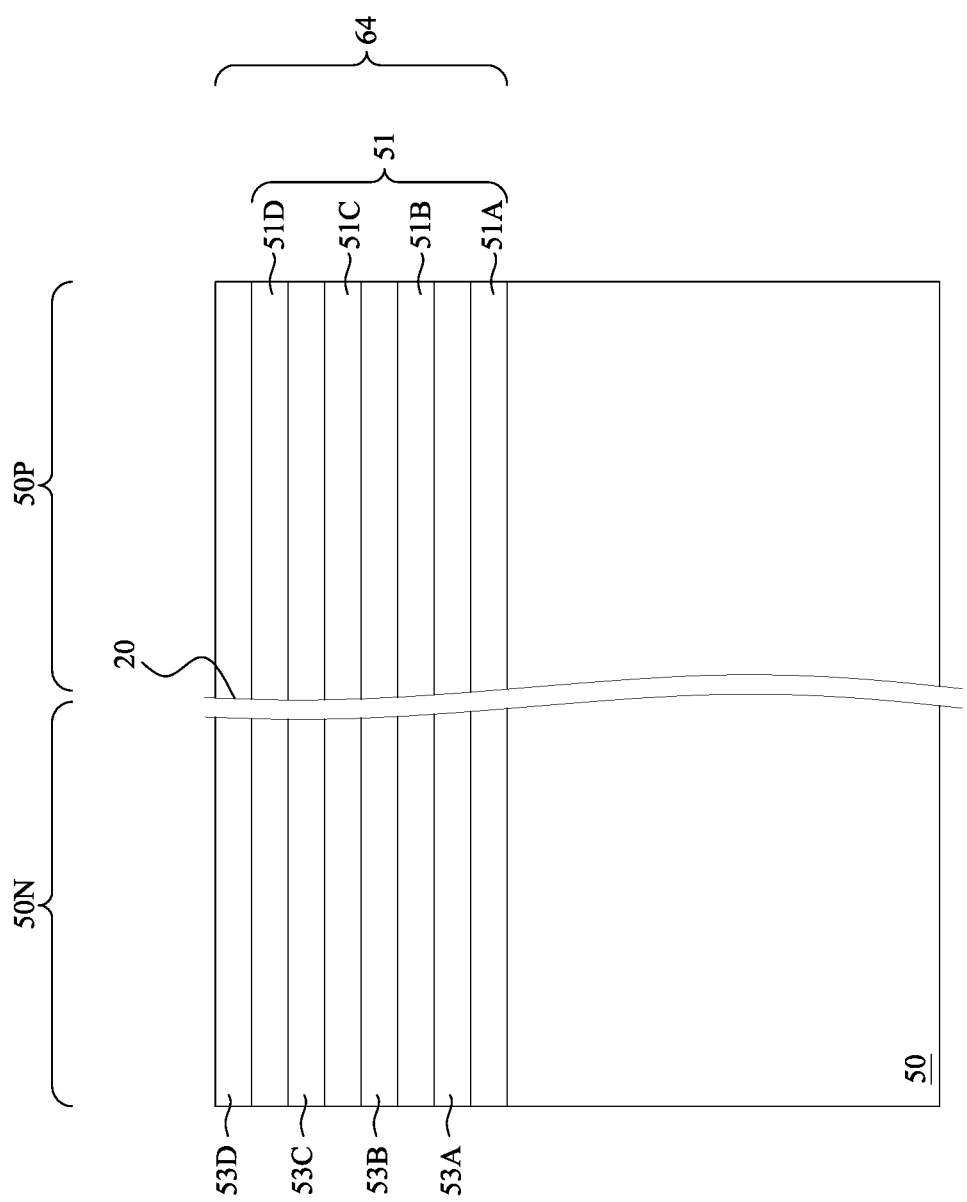

In FIGS. 2A and 2B, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIGS. 2A and 2B, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the first semiconductor layers 51 will be removed and the second semiconductor layers 53 will be patterned to form channel regions of nano-FETs in the p-type regions 50P and the n-type regions 50N. Nevertheless, in some embodiments, the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type regions 50P. In other embodiments, the second semiconductor layers 53 may be removed and the first semiconductor layers 51 may be patterned to form channel regions of nano-FETs in the n-type region 50N, and the first semiconductor layers 51 may be removed and the second semiconductor layers 53 may patterned to form channel regions of nano-FETs in the p-type regions 50P. In still other embodiments, the second semiconductor layers 53 may be removed and the first semiconductor layers 51 may be patterned to form channel regions of nano-FETs in both the n-type region 50N and the p-type region 50P.

In FIGS. 2A and 2B, the multi-layer stack 64 is illustrated as including three layers of each of the first semiconductor layers 51 and the second semiconductor layers 53 for illustrative purposes only. In some embodiments, the multi-layer stack 64 may include any number of the first semiconductor layers 51 and the second semiconductor layers 53, such as four layers of each of the first semiconductor layers 51 and the second semiconductor layers 53 as illustrated in FIG. 2B. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In some embodiments, depositing the multi-layer stack 64 may be performed in a single chamber without breaking vacuum. Further, depositing the multi-layer stack 64 may be an isothermal or mixed process. A process temperature while depositing each of the first semiconductor layers 51 and the second semiconductor layers 53 may be in a range of about 550° C. to about 700° C., and a pressure while depositing the first semiconductor layers 51 and the second semiconductor layers 53 may be in a range of 1 Torr to 50 Torr. Relative thicknesses of each of the first semiconductor layers 51 and/or the second semiconductor layers 53 may be the same in some embodiments.

In various embodiments, the first semiconductor layers 51 may be formed of a first semiconductor material, such as silicon germanium, or the like, and the second semiconductor layers 53 may be formed of a second semiconductor material, such as silicon, silicon carbon, or the like. In such embodiments, precursors flowed during the deposition of the first semiconductor layers 51 may include $GeH_4$, $H_2$, HCL, combinations thereof, or the like, and precursors flowed during the deposition of the second semiconductor layers 53 may include $SiH_4$, $SiH_2Cl_2$, HCL, $H_2$, $N_2$, combinations thereof, or the like. The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material, thereby allowing the second semiconductor layers 53 to be patterned to form channel regions of NSFETS.

In some embodiments, a germanium concentration in each of the first semiconductor layers 51 is varied to vary an etch-sensitivity of each of the first semiconductor layers 51. The germanium concentration in the first semiconductor layers 51 may increase in a direction towards the substrate 50. As a result, lower ones of the first semiconductor layers may be etched more readily during subsequent etching processes (e.g., as described in FIGS. 10A and 10B), which compensates for non-uniform etching characteristics of the etching processes. For example, in FIGS. 2A and 2B, the semiconductor layer 51A may have a greater germanium concentration than the semiconductor layer 51B, and the semiconductor layer 51B may have a greater germanium concentration than the semiconductor layer 51C. In FIG. 2B, the semiconductor layer 51C may further have a greater germanium concentration than the semiconductor layer 51D. In some embodiments, a germanium concentration of the semiconductor layer 51A may be in a range of 25% to 45%; a germanium concentration of the semiconductor layer 51B may be in a range of 20% to 40%; a germanium concentration of the semiconductor layer 51C may be in a range of 15% to 35%; and a germanium concentration of the semiconductor layer 51D may be in a range of 10% to 30%. It has been observed that when the germanium concentration of the first semiconductor layers 51 falls within the above ranges, relatively uniform gate structures can be formed in subsequent processes. Other germanium concentrations are also possible.

In some embodiments, an in-situ doping process may be performed on each of the first semiconductor layers 51 to dope the first semiconductor layers 51 with a Group III element. For example, each of the first semiconductor layers 51 may be doped with boron by flowing a boron comprising precursor (e.g., $B_2H_6$, or the like) during the deposition of the first semiconductor layers 51. Other Group III element dopants are also possible.

Doping the Group III element into the first semiconductor layers 51 may be beneficial to enhance susceptibility to etching and reduce defects (e.g., undesirable residue of the first semiconductor layers 51) during the subsequent etching processes (e.g., as described in FIGS. 10A and 10B). The first semiconductor layers 51A, 51B, 51C, and 51D may have varying concentrations of the Group III element dopant. For example, a concentration of the Group III element dopant may increase in the first semiconductor layers 51 in a direction towards the substrate 50. For example, in FIGS. 2A and 2B, the semiconductor layer 51A may have a greater Group III element dopant concentration than the semiconductor layer 51B, and the semiconductor layer 51B may have a greater Group III element dopant concentration than the semiconductor layer 51C. In FIG. 2B, the semiconductor layer 51C may further have a greater Group III element dopant concentration than the semiconductor layer 51D. In some embodiments, a Group III element dopant concentration of the semiconductor layer 51A may be in a range of $5 \times 10^{19}$ at/cm$^3$ to $5 \times 10^{20}$ at/cm$^3$; a Group III element dopant concentration of the semiconductor layer 51B may be in a range of $1 \times 10^{19}$ at/cm$^3$ to $8 \times 10^{19}$ at/cm$^3$; a Group III element dopant concentration of the semiconductor layer 51C may be in a range of $5 \times 10^{18}$ at/cm$^3$ to $3 \times 10^{19}$ at/cm$^3$; and a Group III element dopant concentration of the semiconductor layer 51D may be in a range of $1 \times 10^{18}$ at/cm$^3$ to $8 \times 10^{18}$ at/cm$^3$. It has been observed that when the Group III element dopant concentration of the first semiconductor layers 51 falls within the above ranges, manufacturing defects can be advantageously reduced when the first semiconductor layers 51 are etched. Other embodiments may include other concentrations of the Group III element dopant.

Figure 2E:
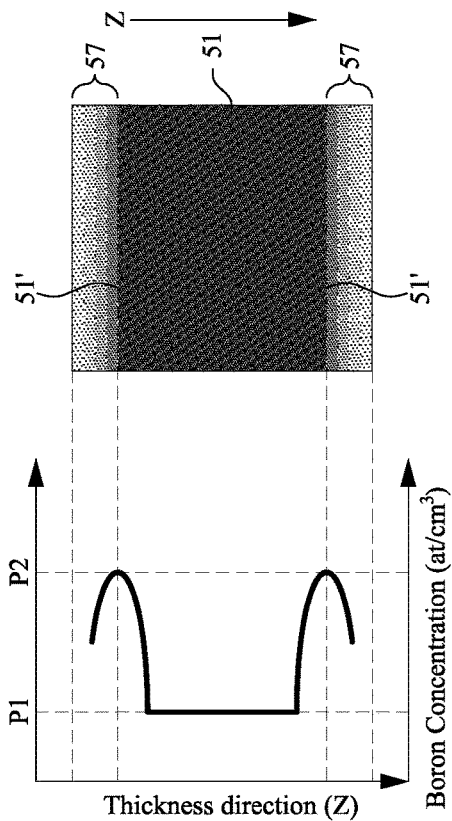
Figure 2C:
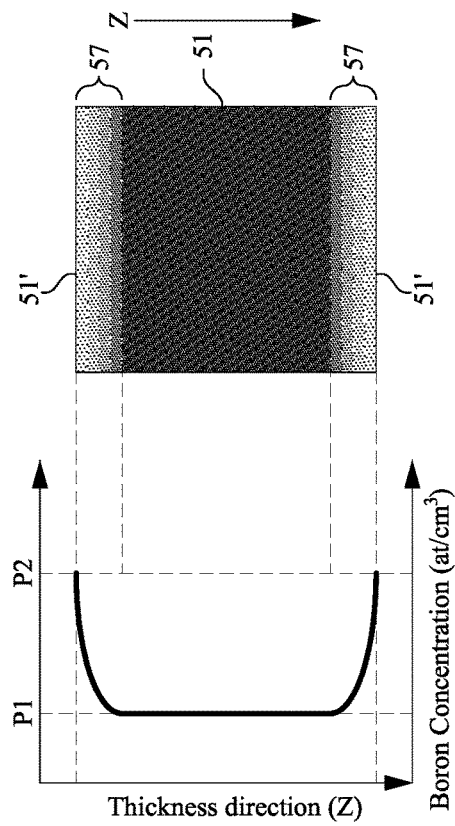
Figure 2D:
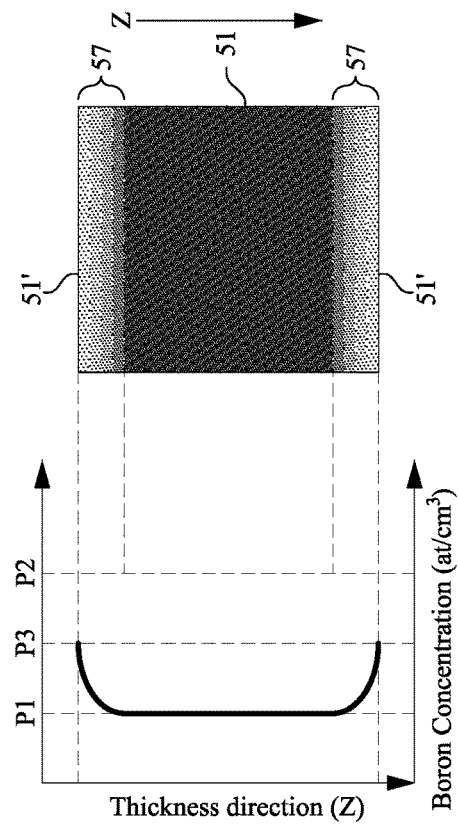

Further, each of the first semiconductor layers 51 may have a uniform concentration of the Group III element dopant or a varying concentration of the Group III element dopant. For example, FIGS. 2C, 2D, and 2E illustrates the Group III dopant concentration in the first semiconductor layers 51 according to some alternative embodiments. The dopant concentrations illustrated in the FIGS. 2C, 2D, and 2E could be applied to any of the first semiconductor layers 51 (e.g., layers 51A, 51B, 51C, and/or 51D) described above. In FIG. 2C, the Group III element dopant concentration of the first semiconductor layer 51 is between P1 and P2 where P1 is a minimum dopant concentration of the first semiconductor layer 51 and P2 is a maximum dopant concentration of the first semiconductor layer 51. In some embodiments, the minimum dopant concentration P1 is 0%. A Group III dopant containing region 57 of the first semiconductor layer 51 may have a thickness in a range of about 1 nm to about 5 nm, for example. In the embodiment of FIG. 2C, the first semiconductor layer 51 has a maximum Group III element dopant concentration at top and bottom surfaces 51' of the first semiconductor layer 51, and the Group III element dopant concentration of the first semiconductor layer 51 is a gradient that decreases towards a center of the first semiconductor layer 51.

FIG. 2D illustrates a similar configuration as FIG. 2C except that the first semiconductor layer 51 in FIG. 2D has a maximum Group III element dopant concentration of P3, which is less than the maximum dopant concentration P2 of the first semiconductor layer 51 in FIG. 2C. Similar to the embodiment of FIG. 2C, a minimum Group III element dopant concentration of the first semiconductor layer is P1, and a Group III dopant containing region 57 of the first semiconductor layer 51 may have a thickness in a range of about 1 nm to about 5 nm, for example. Similar to FIG. 2C, in FIG. 2D, the first semiconductor layer 51 has a maximum Group III element dopant concentration at top and bottom surfaces 51' of the first semiconductor layer 51, and the Group III element dopant concentration of the first semiconductor layer 51 is a gradient that decreases towards a center of the first semiconductor layer 51.

In FIG. 2E, the Group III element dopant concentration of the first semiconductor layer 51 is between P1 and P2 where P1 is a minimum dopant concentration of the first semiconductor layer 51 and P2 is a maximum dopant concentration of the first semiconductor layer 51. In some embodiments, the minimum dopant concentration P1 is 0%. A Group III dopant containing region 57 of the first semiconductor layer 51 may have a thickness in a range of about 1 nm to about 5 nm, for example. In the embodiment of FIG. 2E, the first semiconductor layer 51 has a maximum Group III element dopant concentration at levels 51" in an interior of the first semiconductor layer 51. The Group III element dopant concentration is a gradient that decreases in directions away from the levels 51". As will be explained subsequently, the dopant concentration of the Group III element dopants in the first semiconductor layer 51 may be used to determine a shape of resulting gate regions and inner sidewall spacers in the resulting transistors. Further, different dopant concentration profiles can be achieved in the first semiconductor layers 51 by varying a flow speed and/or concentration of the group III dopant-comprising precursor during the deposition of the first semiconductor layers 51.

Figure 3:
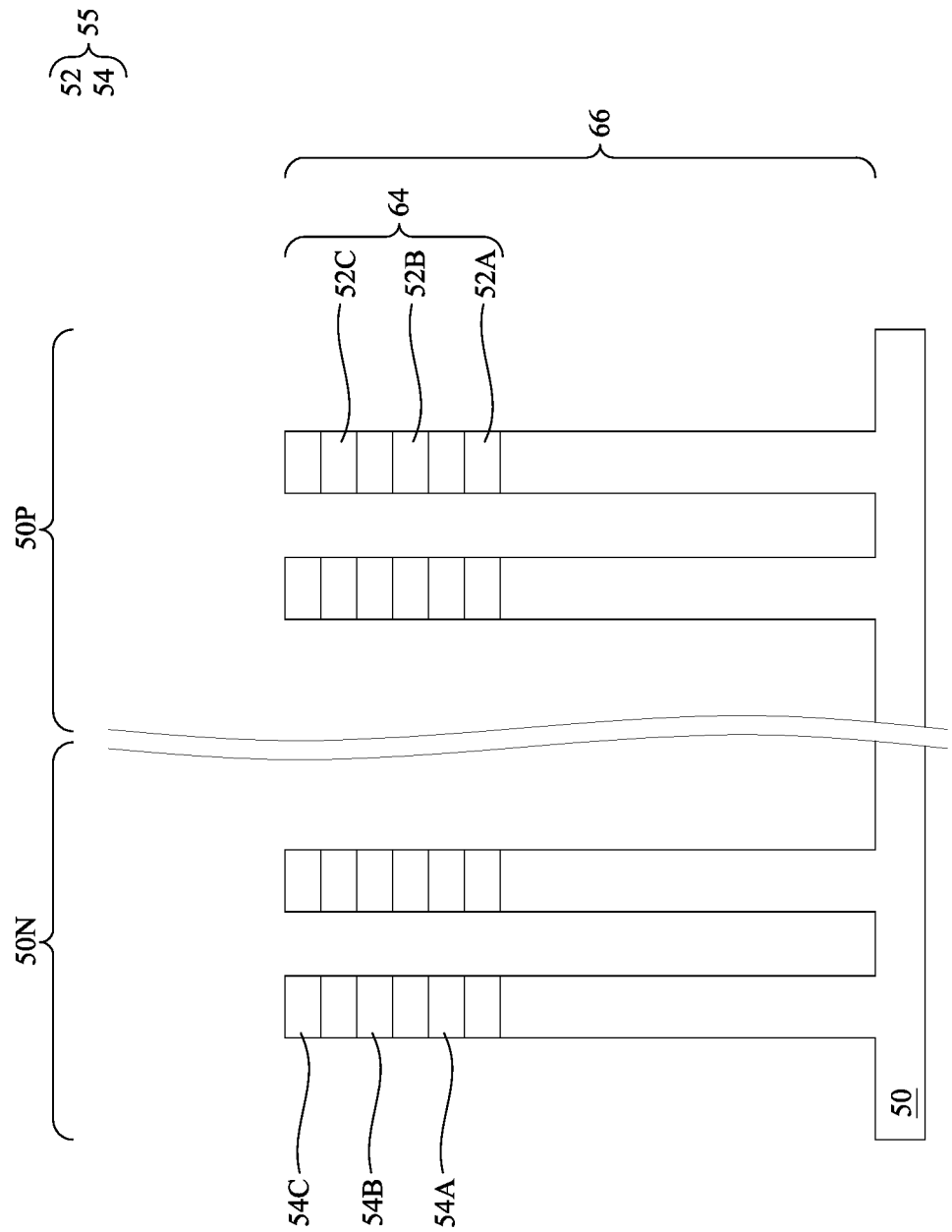

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55. Although FIG. 3 and subsequent processes illustrate further processing based on the embodiments of FIG. 2A, the processing may also be applied to the embodiments of FIG. 2B.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
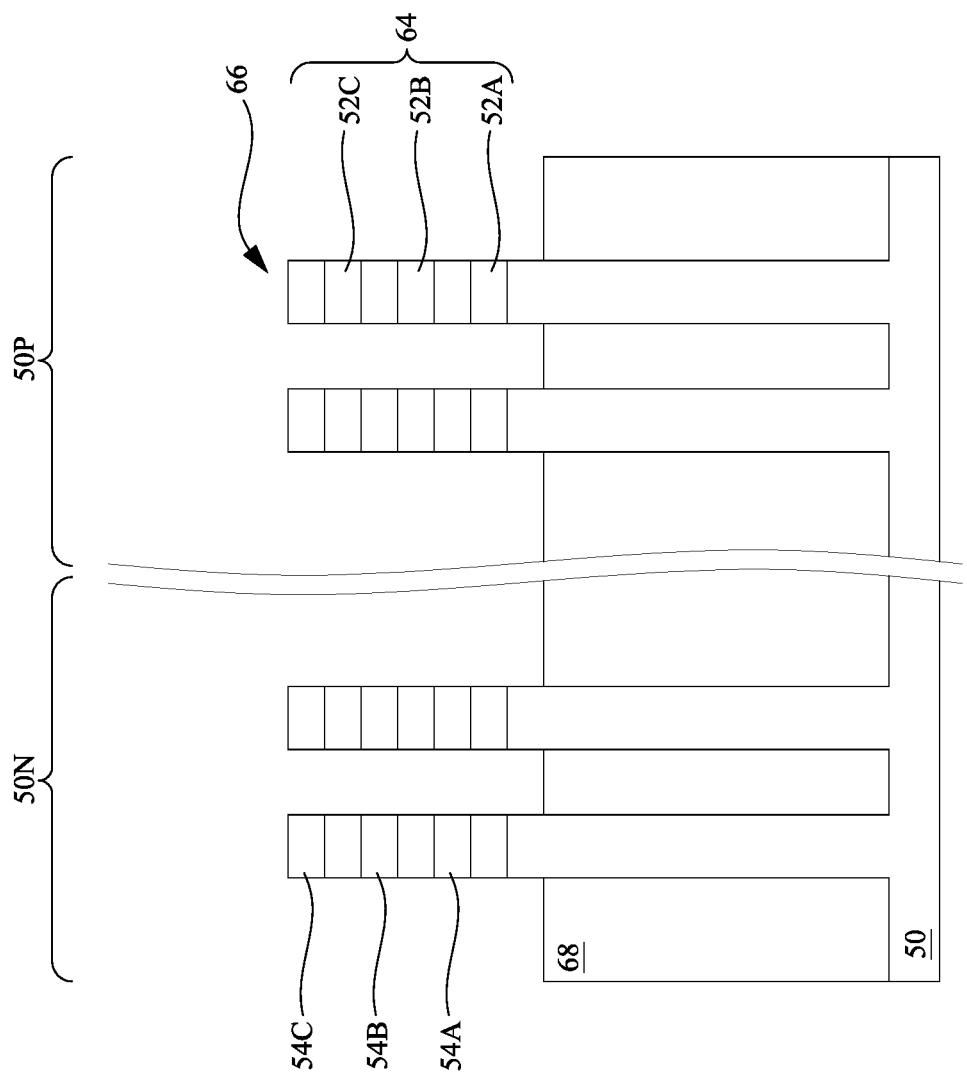

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the regions 50N and the region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2A through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated)

is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
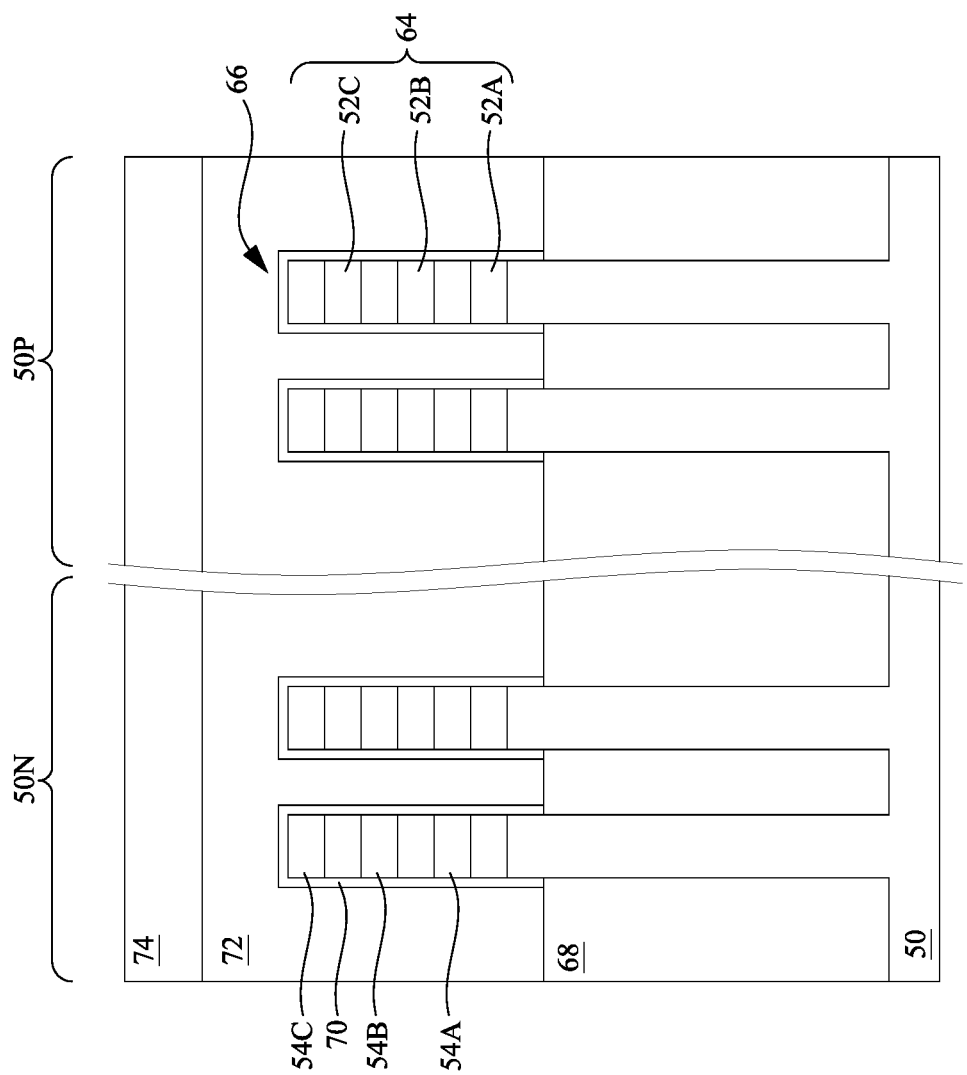

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
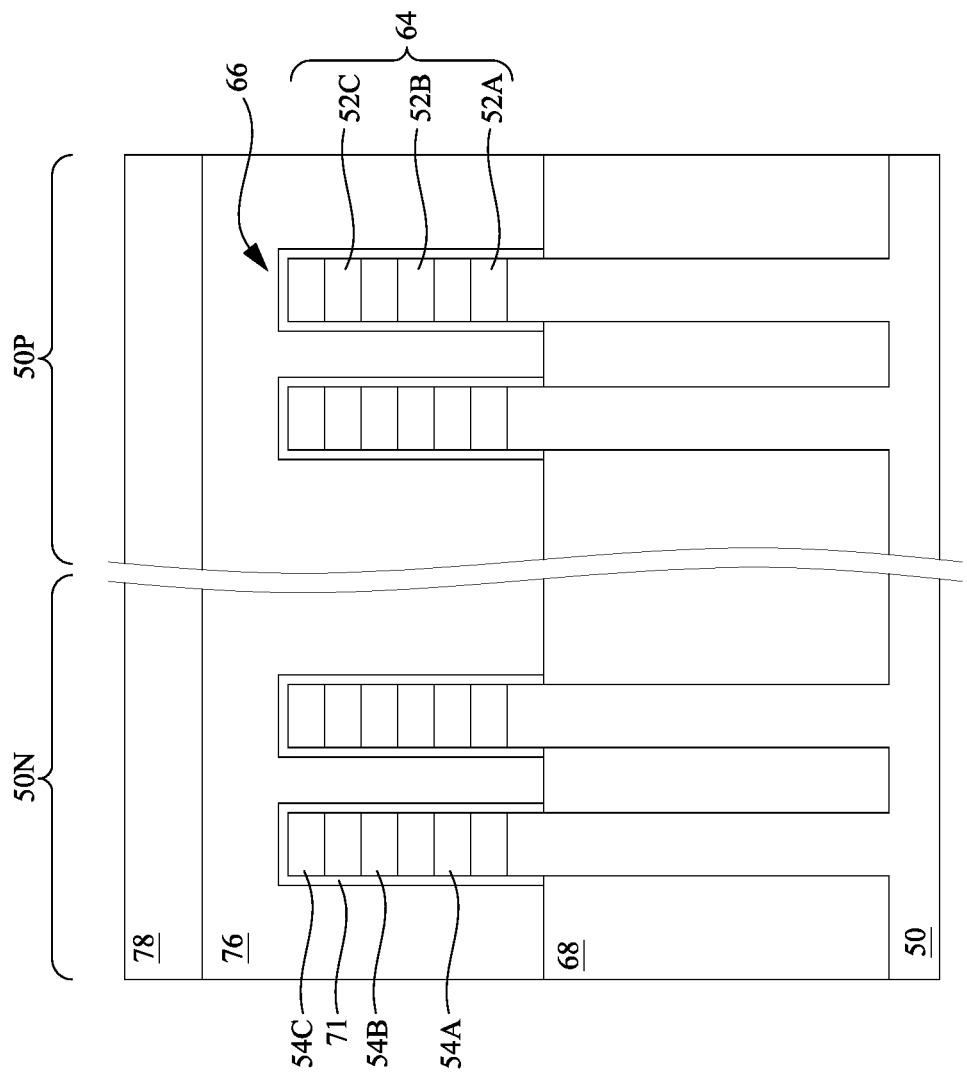
Figure 6B:
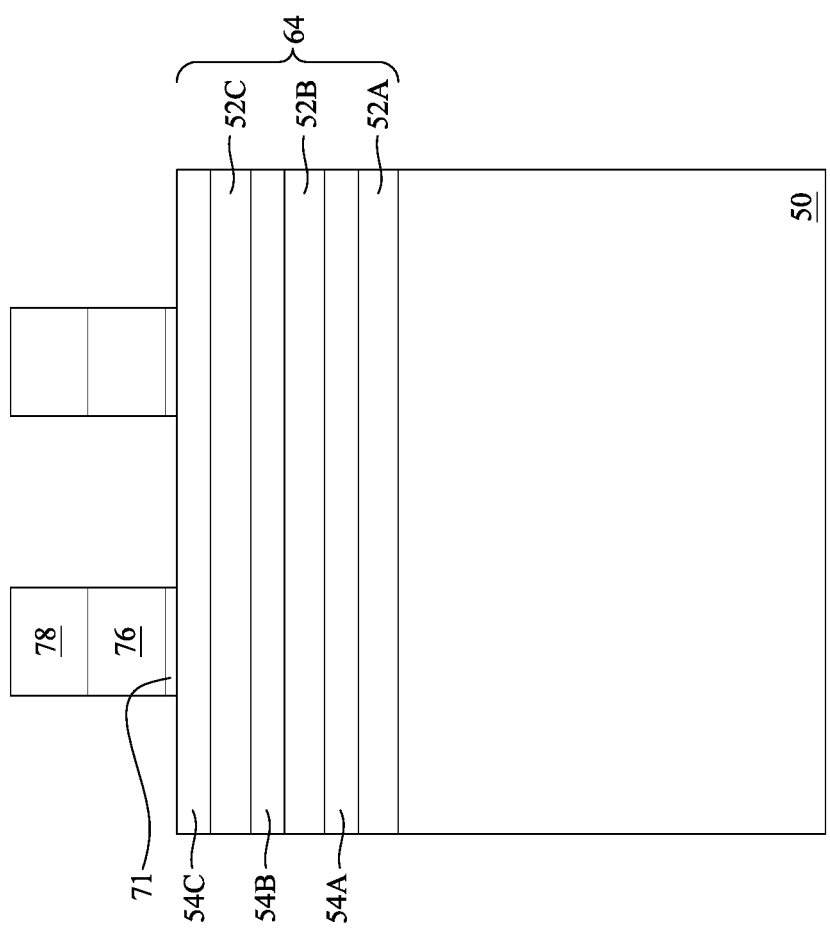

FIGS. 6A through 20C illustrate various additional steps in the manufacturing of embodiment devices. FIGS. 6A, 6B, 7A, 7B, 8A, 8B, 9A, 9B, 10A, 10B, 10C, 10D, 11A, 11B, 12A, 12B, 12C, 13A, 13B, 13C, 14A, 14B, 15A, 15B, 16A, 16B, 17A, 17B, 17C, 17D, 17E, 17F, 17G, 17H 18A, 18B, 18C, 19A, 19B, 19C, 20A, 20B, and 20C illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-align subsequently formed source/drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
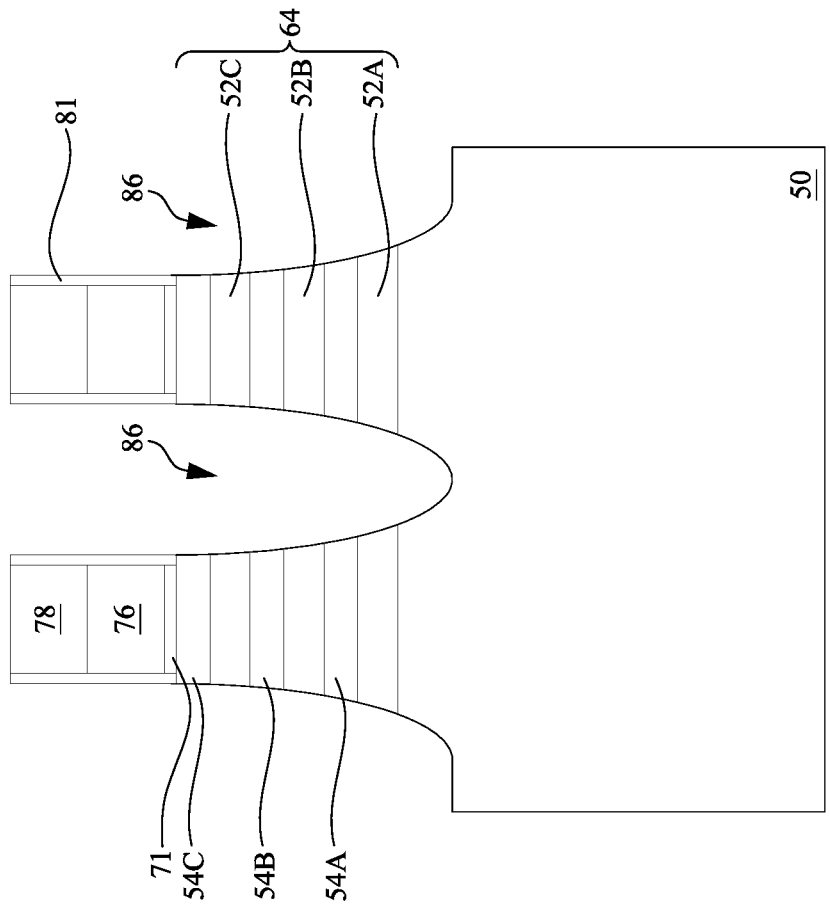
Figure 9A:
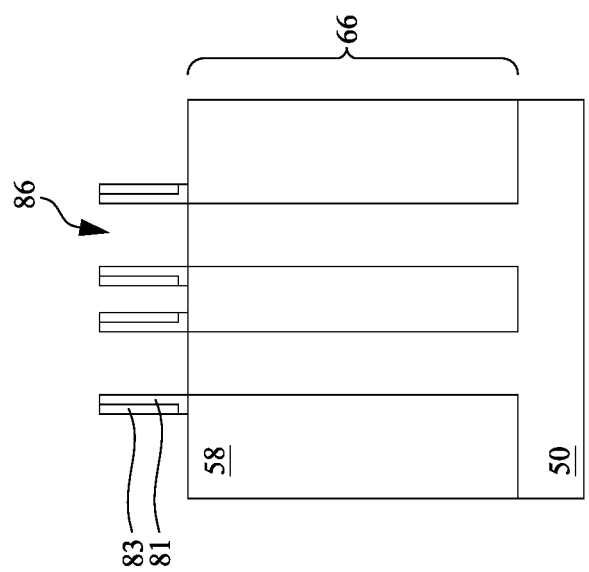

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 58 may be level with bottom surfaces of the first recesses 86. In various embodiments, the fins 66 may be etched such that bottom surfaces of the first recesses 86 are disposed below the top surfaces of the STI regions 68; or the like.

The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth. Due to the non-uniform nature of anisotropic etch processes, a width of the first recesses 86 may decrease in a direction towards the substrate 50. As a result, each of the nanostructures 55 may have tapered sidewalls and increase in width in a direction towards the substrate 50. For example, the width of the nanostructure 52A is greater than a width of the nano structure 52B, and the width of the nanostructure 52B is greater than a width of the nanostructure 52C. Further, the width of the nanostructure 54A is greater than a width of the nanostructure 54B, and the width of the nanostructure 54B is greater than a width of the nanostructure 54C.

In FIGS. 10A and 10B, portions of sidewalls of the layers of the multi-layerstack 64 formed of the first semiconductor materials (e.g., the first nanostructures 52) exposed by the first recesses 86 are etched to form sidewall recesses 88 in the n-type region 50N and in the p-type region 50P. The sidewalls may be etched using isotropic etching processes, such as wet etching or the like. In an embodiment in which the first nanostructures 52 include, e.g., SiGe, and the second nanostructures 54 include, e.g., Si or SiC, a cyclic dry (e.g., a plasma etch using $CF_4$, helium, and/or the like) and wet (e.g., a wet clean using HF, HCl, sulfur peroxide mix (SPM), and/or the like) etch process may be used to etch sidewalls of the first nanostructures 52. Due to the different material compositions of each of the nanostructures 52, lower ones of the nanostructures 52 may be etched at a greater rate than upper ones of the nanostructures 52 using a same etch process. As result, recesses 88 increase in dimension in direction towards the substrate 50. In various embodiments, the inclusion of germanium and/or the Group III element dopant (if present) increases the etch selectivity of the first nanostructures 52 relative to the second nanostructures 54. As a result, after recessing, each of the nanostructures 52 may have a relatively uniform width W1, and differences in widths of the nanostructures 52 from previous etching processes (e.g., in FIGS. 9A and 9B) may be reduced. The width W1 may be measured between opposing sidewalls of each of the nanostructures 52 in a cross-section that is extends through the fins 55 and perpendicular to a lengthwise dimension of the dummy gates 76.

For example, as described above, a germanium and/or Group III element dopant concentration of the nanostructure 52A is greater than a germanium and/or Group III element dopant concentration of the nanostructure 52B, and the germanium and/or Group III element dopant concentration of the nanostructure 52B is greater than a germanium and/or Group III element dopant concentration of the nanostructure 52C. A higher germanium and/or Group III element dopant concentration allows for a higher etch rate while etching the recesses 88. As such, the nanostructure 52A is etched more than the nanostructure 52B while patterning the recesses 88, and the nanostructures 52B are etched more than the nanostructures 52C while patterning the recesses 88. Accordingly, by adjusting relative germanium and/or Group III dopant concentrations of each of the nanostructures 52, a width W1 of each of the nanostructures 52 is relatively uniform after etching the recesses 88. Accordingly, the non-uniform etching of the recesses 86 may be compensated, and the resulting gate structures that replace the nanostructures 52 may be a relatively uniform gate length (e.g., a distance of the gate between corresponding source/drain regions may be correspond to the width W1 and be relatively uniform in the resulting structure).

Although sidewalls of the first nanostructures 52 in recesses 88 are illustrated as being concave in FIG. 10B, the sidewalls may be straight or convex. The different sidewall profiles of the first nanostructures 52 can be formed by adjusting the Group III element dopant concentration profile of the nanostructures 52 (e.g., which are patterned from the first semiconductor layers 51 described in FIG. 2, above). For example, the concave sidewalls of the first nanostructures 52 in FIG. 10B can be achieved by having a Group III element dopant concentration as described above in FIG. 2C. As another example, the straight sidewalls of the first nanostructures 52 in FIG. 10C can be achieved by having a Group III element dopant concentration as described above in FIG. 2D. Further, the convex sidewalls of the first nanostructures 52 in FIG. 10D can be achieved by having a Group III element dopant concentration as described above in FIG. 2E. A distance that each of the recesses 88 extends past sidewalls of the second nanostructures 54 may be adjusted by adjusting the germanium concentration of each of the first nanostructures 52. Further, the inclusion of the Group III element dopant may reduce or eliminate residue left from the first nanostructures 52 in the recesses 88. Accordingly, defects may be reduced, and device performance may be improved.

Figure 11B:
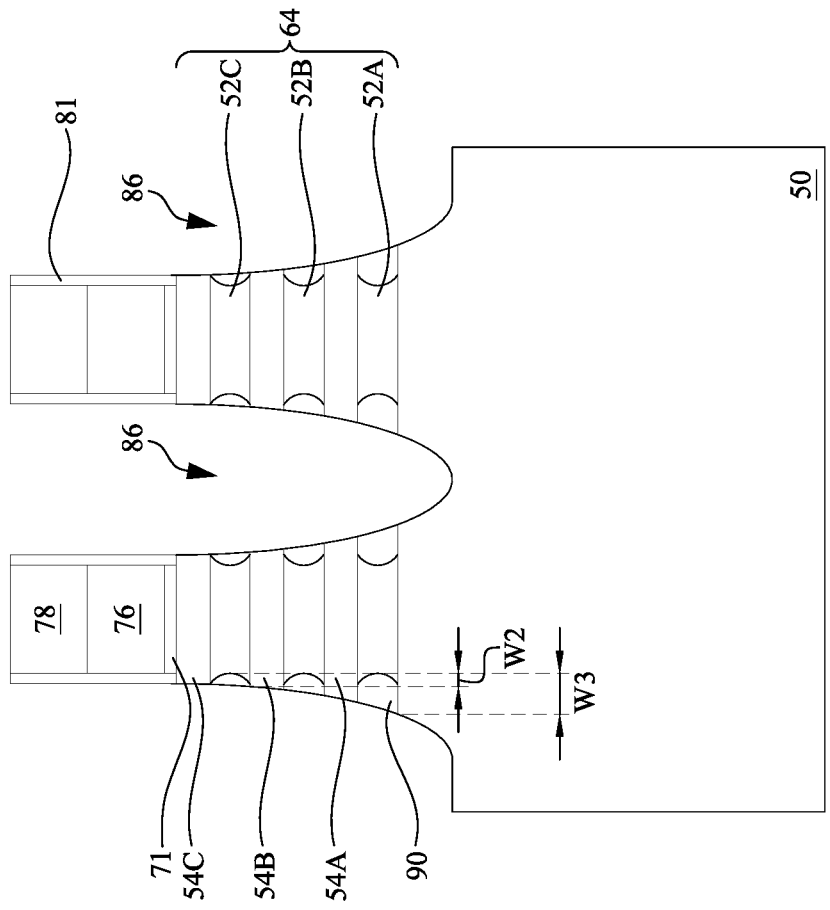
Figure 11A:
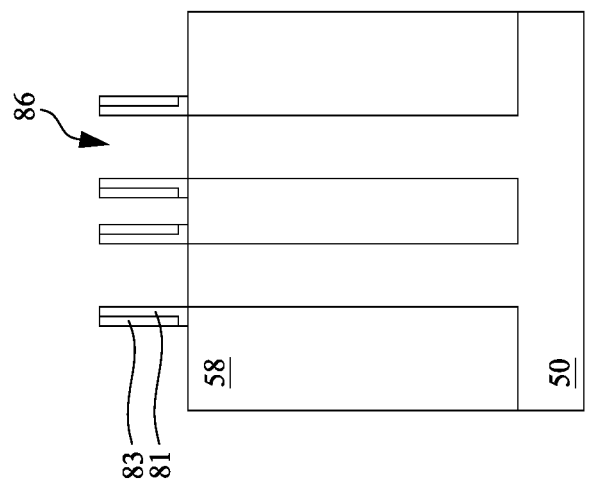

In FIGS. 11A-11B, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the recesses 86, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54 (see e.g., FIGS. 10A-10C).

In addition, the inner spacers 90 may increase in width in a direction towards the substrate 50. For example, a width W2 of a topmost one of the inner spacers 90 may be in a range of about 1 nm to about 3 nm. It has been observed that when the minimum width of the inner spacers 90 is less than the above range, leakage may result. Further, a width W3 of a bottommost one of the inner spacers 90 may be in a range of about 2 nm to about 5 nm. In various embodiments, the width W2 of the topmost inner spacers 90 is a minimum width of the inner spacers 90, and the width W3 of the bottommost inner spacers 90 is a maximum width of the inner spacers. A difference between the width W2 and the width W3 may be in a range of about 1 nm to about 4 nm, and a ratio of the width W2 to the width W3 may be in a range of about 0.1 to about 1. The widths W2 and W3 may be measured between opposing sidewalls of each of respective inner spacers 90 in a cross-section that is extends through the fins 55 and perpendicular to a lengthwise dimension of the dummy gates 76.

Figure 12B:
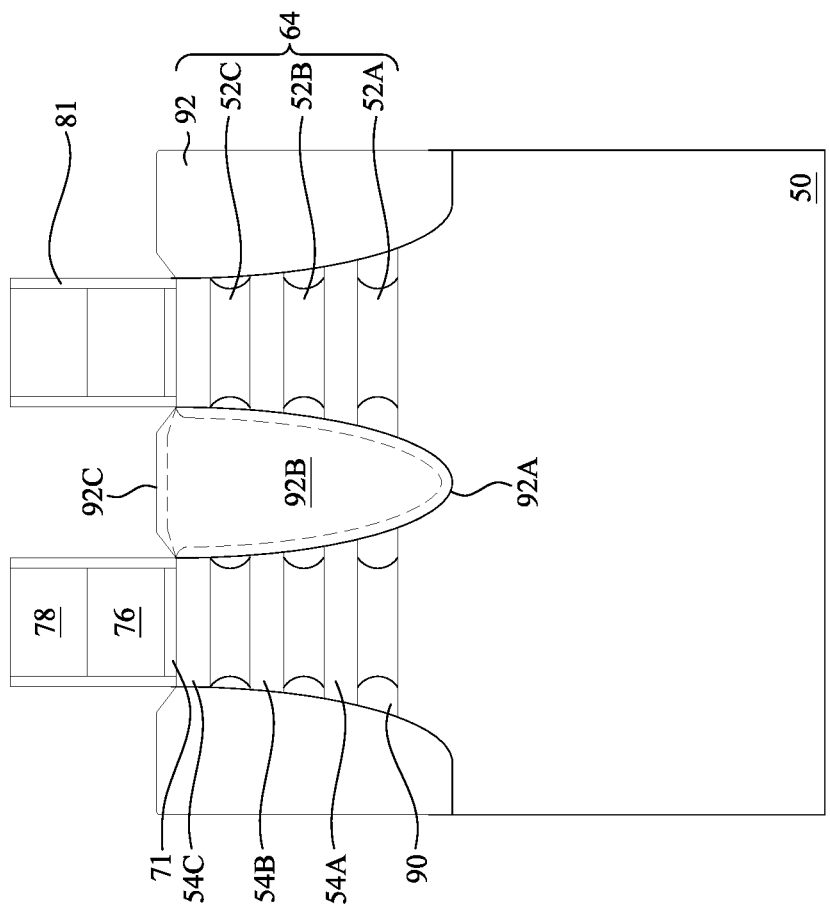
Figure 12A:
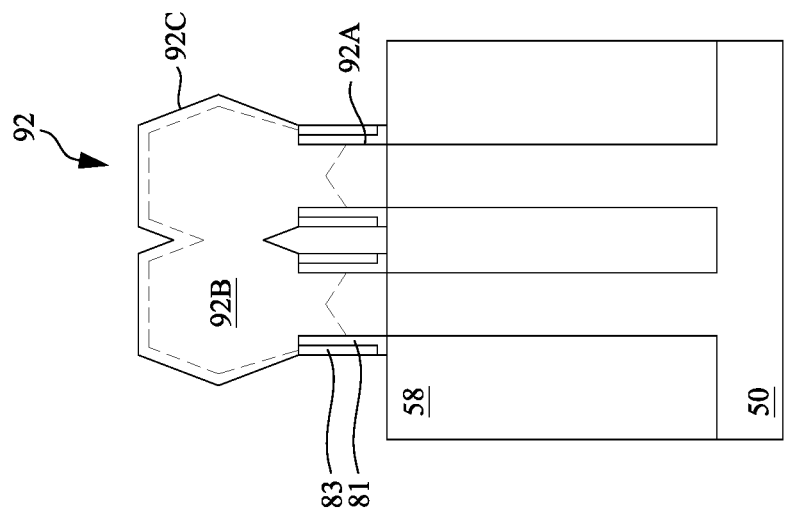
Figure 12C:
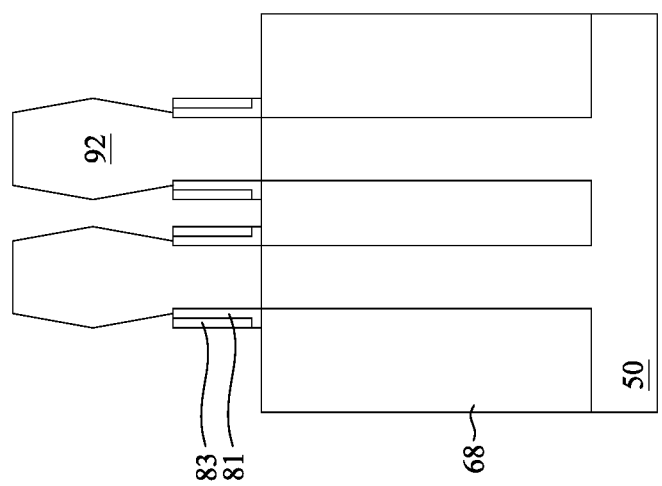

In FIGS. 12A-12C, epitaxial source/drain regions 92 are formed in the first recesses 86. In some embodiments, the source/drain regions 92 may exert stress on the second nanostructures 54, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the second nanostructures 54 are silicon, the epitaxial source/drain regions 92 may comprise materials exerting a compressive strain on the second nanostructures 54, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed on a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 13B:
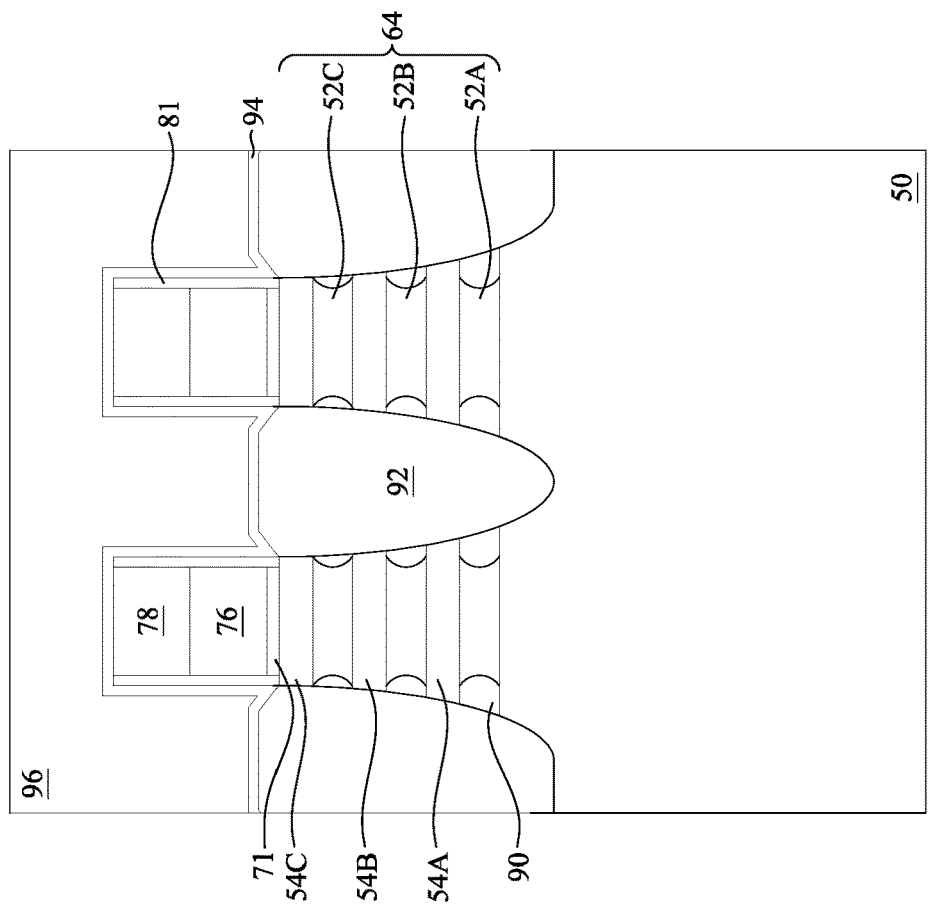
Figure 13A:
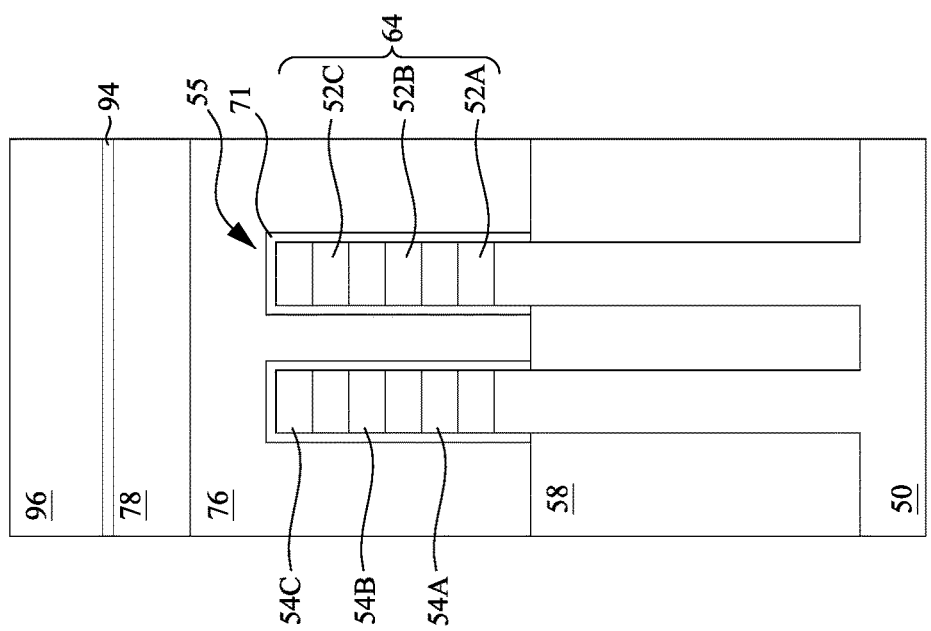
Figure 13C:
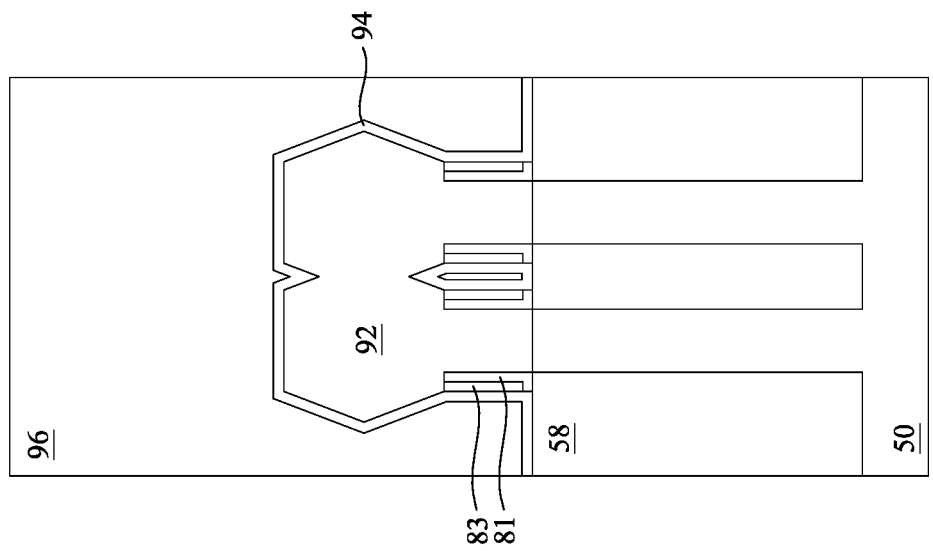

In FIGS. 13A-13C, a first interlayer dielectric (ILD) 96 is deposited over the structure illustrated in FIGS. 6A, 12A, and 12B (the processes of FIGS. 7A-12C do not alter the cross-section illustrated in FIG. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

Figure 14B:
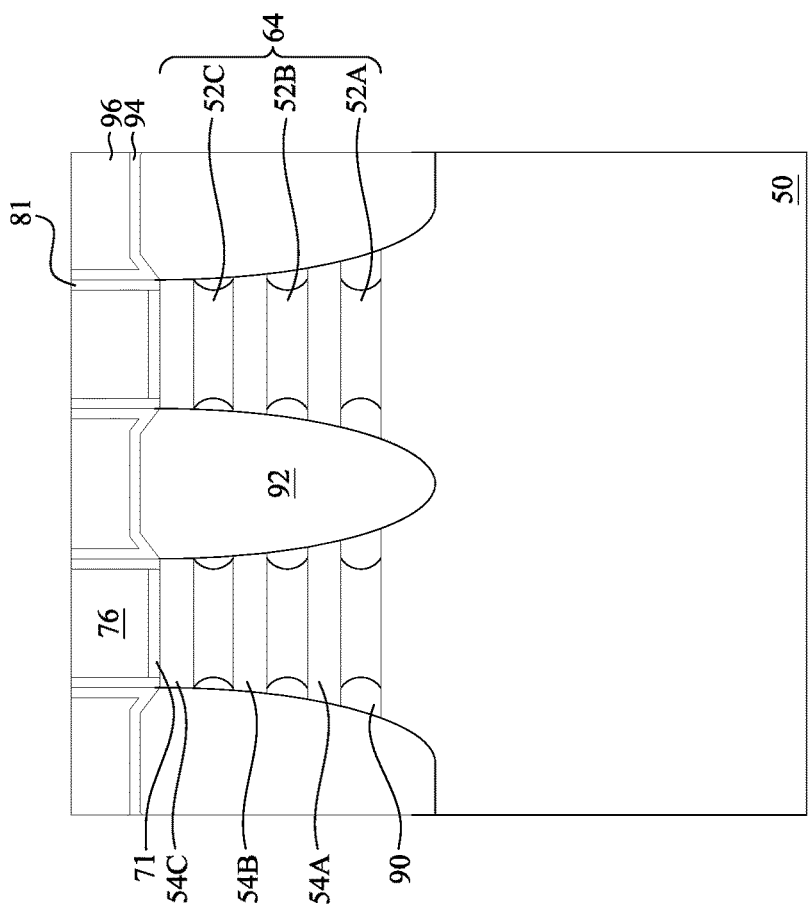
Figure 14A:
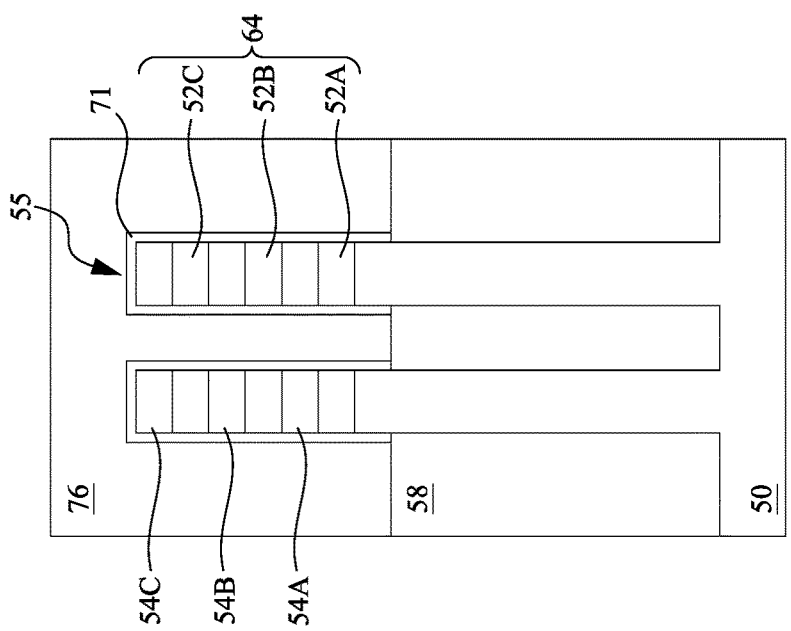

In FIGS. 14A-14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 72 are exposed through the first ILD 96. In some embodiments, the masks 78 may remain, in which case the planarization process levels the top surface of the first ILD 96 with top surface of the masks 78 and the first spacers 81.

Figure 15B:
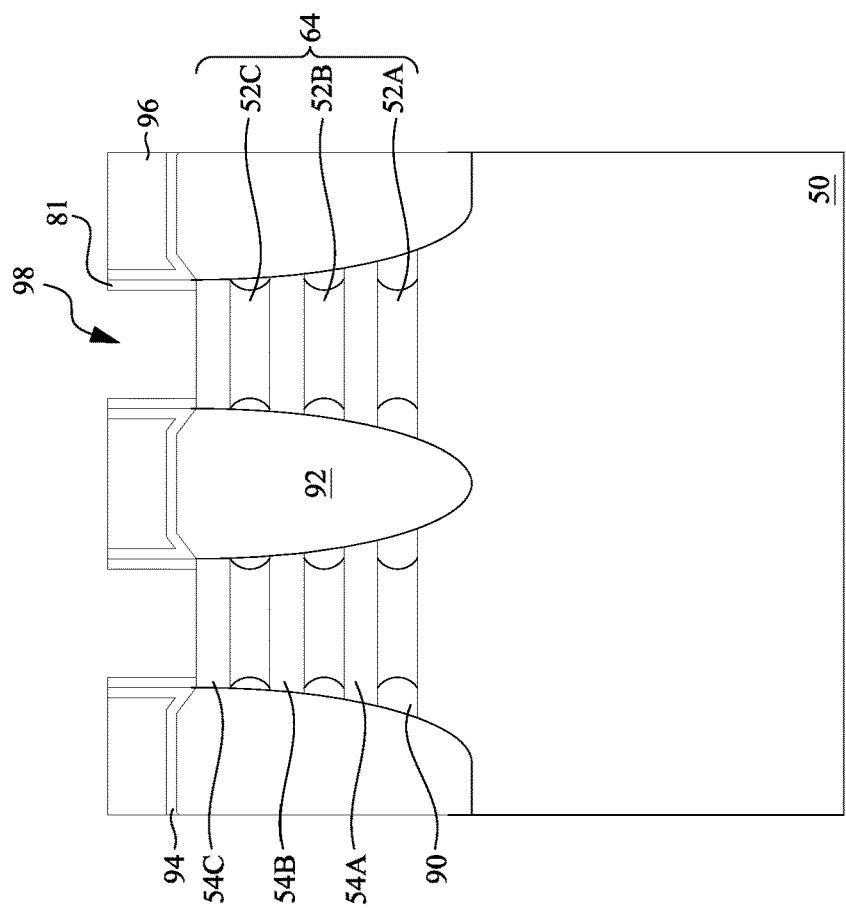
Figure 15A:
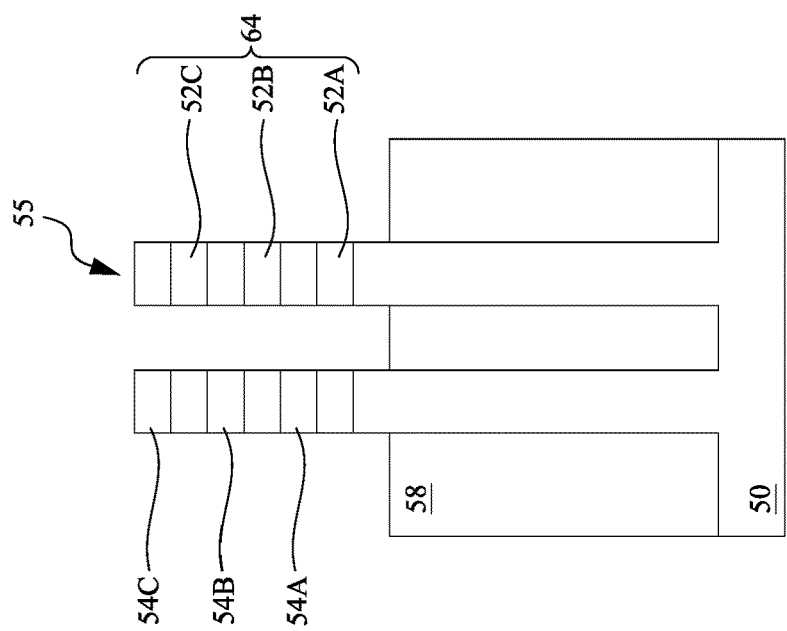

In FIGS. 15A and 15B, the dummy gates 72, and the masks 74 if present, are removed in one or more etching steps, so that second recesses 98 are formed. Portions of the dummy gate dielectrics 71 in the second recesses 98 are also be removed. In some embodiments, the dummy gates 72 and the dummy gate dielectrics 60 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 70 may be used as etch stop layers when the dummy gates 72 are etched. The dummy dielectric layers 70 may then be removed after the removal of the dummy gates 72.

Figure 16B:
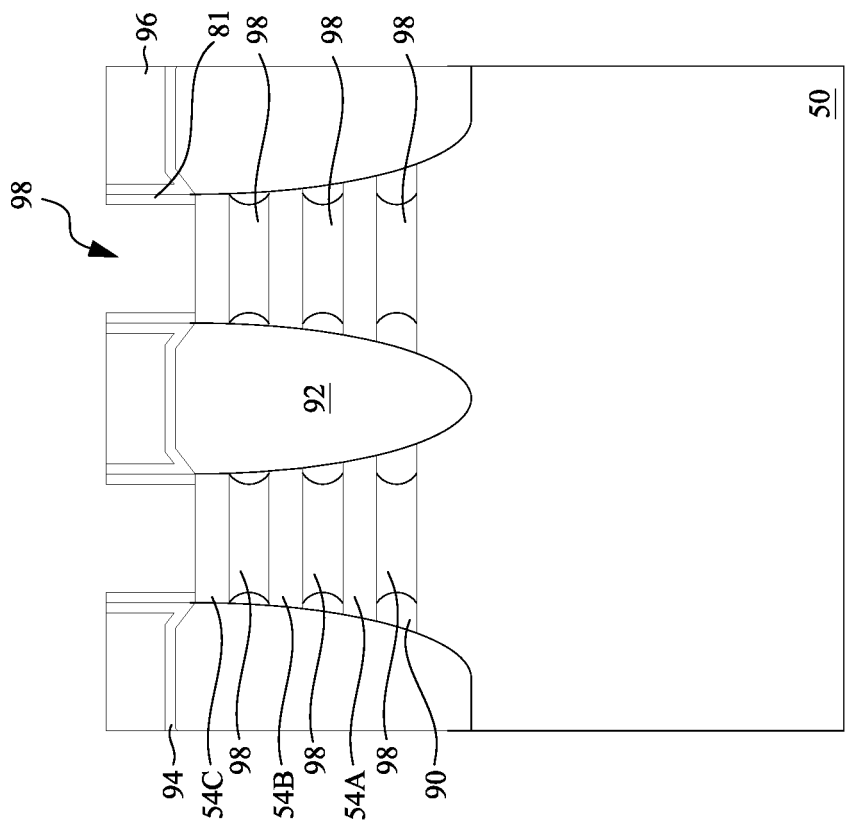
Figure 16A:
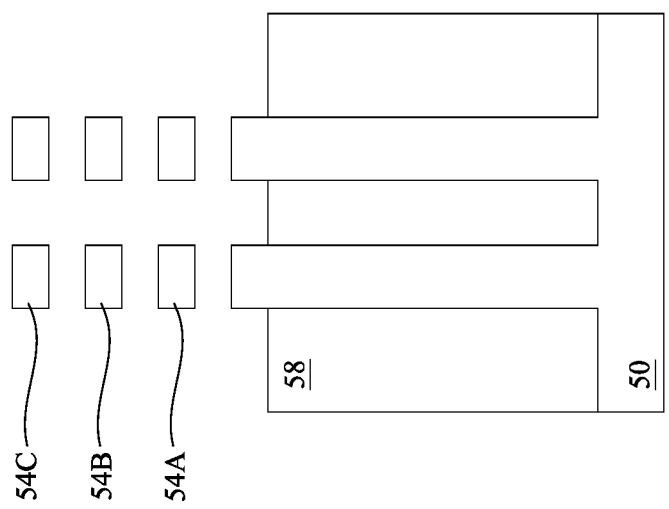

In FIGS. 16A and 16B, the first nanostructures 52 are removed extending the second recesses 98. The first nanostructures 52 may be removed by performing an isotropic etching process such as wet etching or the like using etchants which are selective to the materials of the first nanostructures 52, while the second nanostructures 54, the substrate 50, the STI regions 58 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52. Removing the first nanostructures 52 may expose the inner spacers 90. Due to the processes described above, a distance between pairs of the inner spacers 90 is relatively uniform.

Figure 17A:
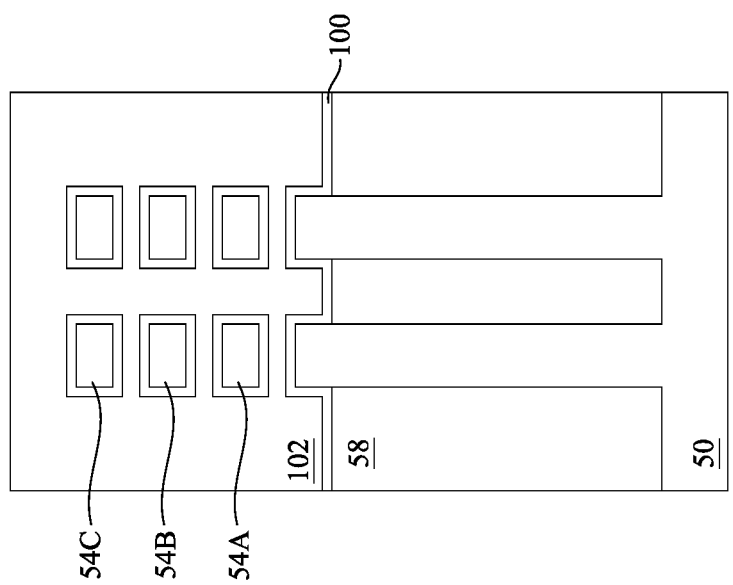
Figure 17C:
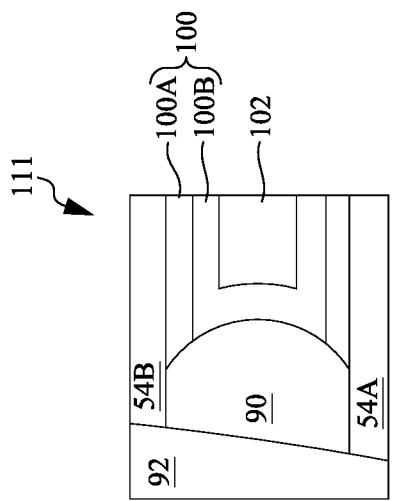
Figure 17B:
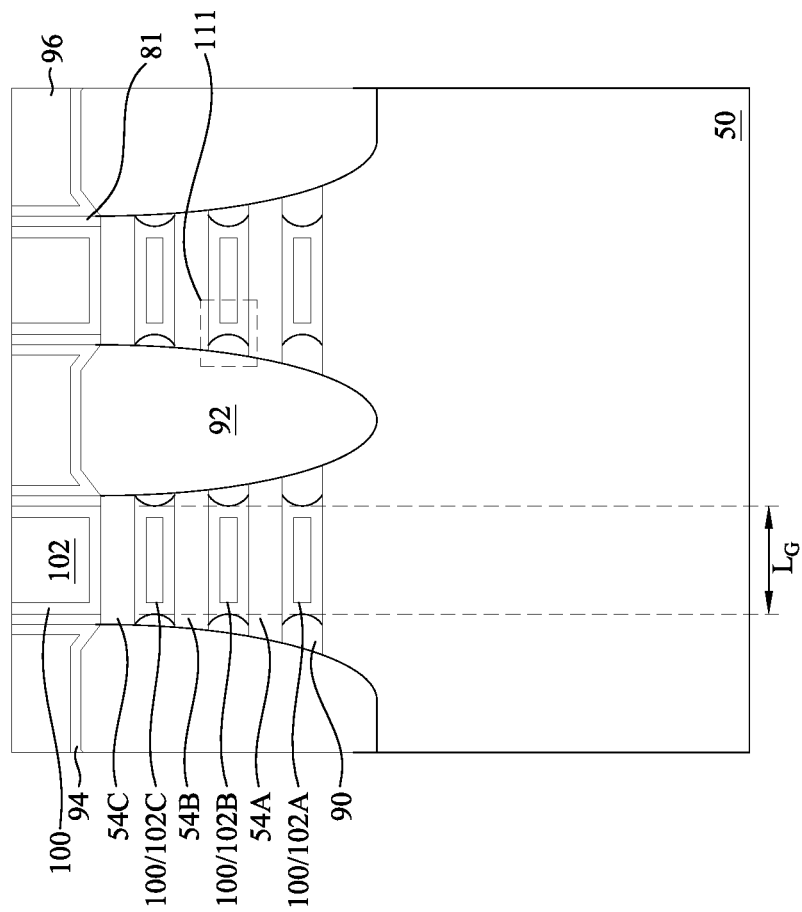

In FIGS. 17A, 17B, and 17C gate dielectric layers 100 and gate electrodes 102 are formed for replacement gates. The gate dielectric layers 100 are deposited conformally in the second recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 58.

As illustrated in FIG. 17C, in accordance with some embodiments, the gate dielectric layers 100 comprise one or more dielectric layers. For example, in some embodiments, the gate dielectric layers 100 may comprise an interfacial oxide layer 100A and a high-k layer 100B over the interfacial oxide layer 100A. In some embodiments, the interfacial oxide layer 100A comprises silicon oxide, silicon oxynitride, or the like, and the high-k dielectric layer 100B may have a k-value greater than 7.0 and include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17B, the gate electrodes 102 may comprise any number of liner layers, any number of work function tuning layers, and a fill material. Any combination of the layers which make up the gate electrodes 102 may be deposited between adjacent ones of the second nanostructures 54.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Due to the processes described above and the varying widths of spacers 90, each of the regions (e.g., gate regions 100/102A, 100/102B, and 100/102C) of the gates structures 100/102 around the nanostructures 54 may have a relatively uniform gate length $L_G$ (e.g., a minimum distance of each of the gate structures 100/102 between the epitaxial source/drain regions 92). The gate length $L_G$ may approximate the width $W_1$ of the nanostructures 52 described above. Accordingly, performance of gate all-around may improve due to the constant gate structure length. For example, improved gate metal filling and better channel turn-on control may be achieved in various embodiments.

FIGS. 17C through 17H illustrate detailed views of various configurations of the gate structures 100/102 and the inner spacers 90 according to various embodiments. FIGS. 17C, 17D, and 17E illustrate embodiments where the inner spacers 90 are flush with sidewalls of the nanostructures 54B, and FIGS. 17F, 17G, and 17H illustrate embodiments where the inner spacers 90 are recessed from sidewalls of the nanostructures 54B. In FIGS. 17F, 17G, and 17H, source/drain regions 92 further extend past sidewalls of the nanostructures 54B and extend between nanostructures 54B. FIGS. 17C and 17F illustrate embodiments where the nanostructures 52 are formed with concave sidewalls, and the inner spacers 90 are formed with convex sidewalls. As such, the resulting gate structures 100/102 likewise have concave sidewalls. The embodiments of FIGS. 17C and 17F may be achieved, for example, by providing first semiconductor layers 52 with the doping concentration described above in FIG. 2C. FIGS. 17D and 17G illustrate embodiments where the nanostructures 52 are formed with straight sidewalls, and the inner spacers 90 are formed with straight sidewalls. As such, the resulting gate structures 100/102 likewise have straight sidewalls. The embodiments of FIGS. 17D and 17G may be achieved, for example, by providing first semiconductor layers 52 with the doping concentration described above in FIG. 2D. FIGS. 17E and 17H illustrate embodiments where the nanostructures 52 are formed with convex sidewalls, and the inner spacers 90 are formed with concave sidewalls. As such, the resulting gate structures 100/102 likewise have convex sidewalls. The embodiments of FIGS. 17E and 17H may be achieved, for example, by providing first semiconductor layers 52 with the doping concentration described in FIG. 2E.

Figure 18B:
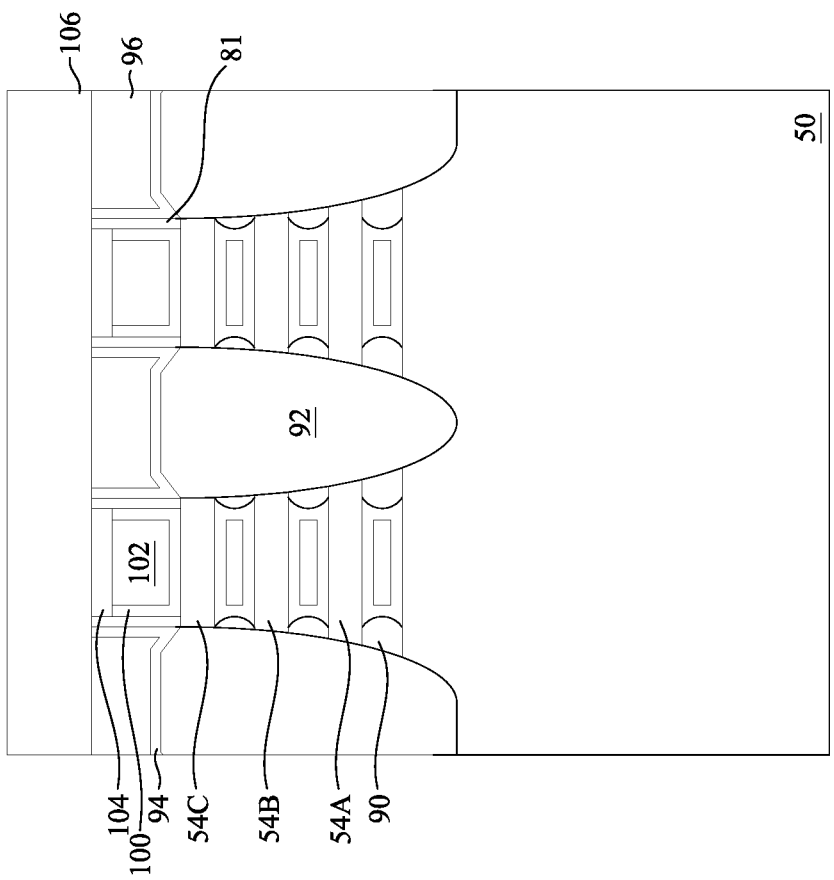
Figure 18A:
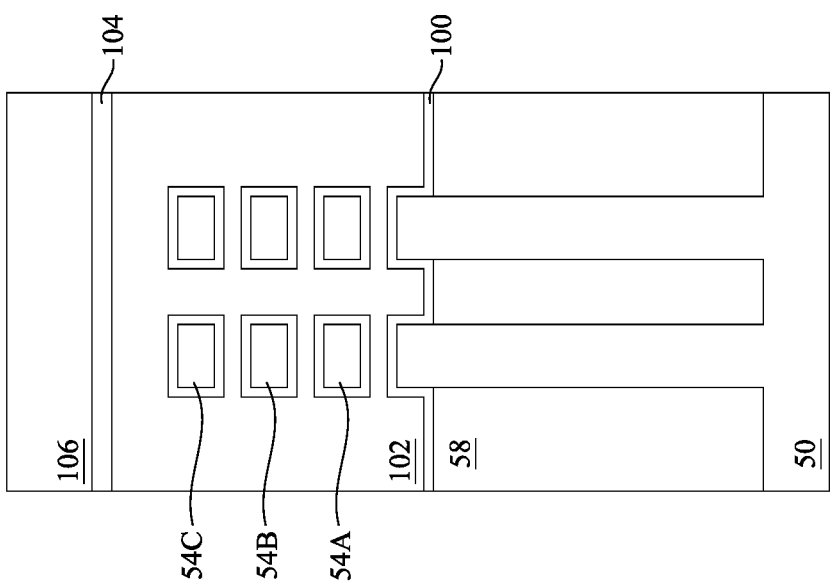
Figure 18C:
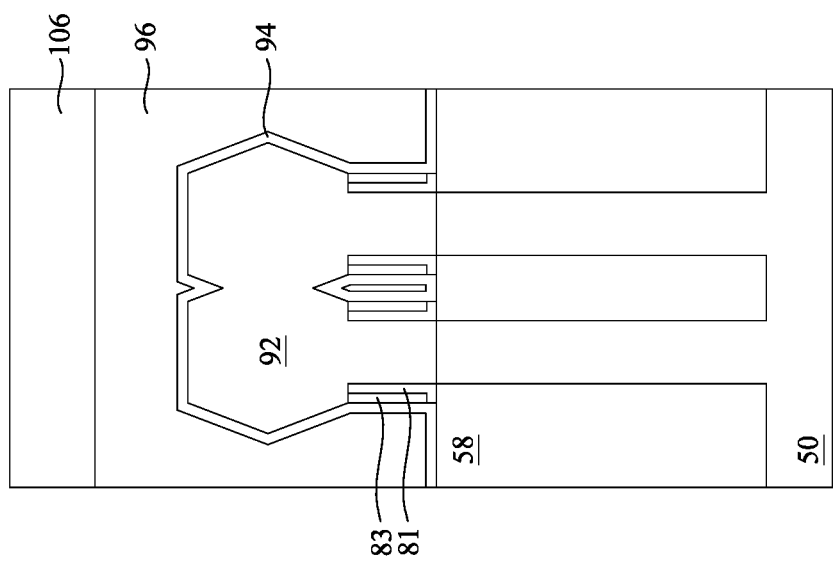

In FIGS. 18A-18C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 20A-20C) penetrate through the gate mask 104 to contact the top surface of the recessed gate electrodes 102.

As further illustrated by FIGS. 18A-18C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
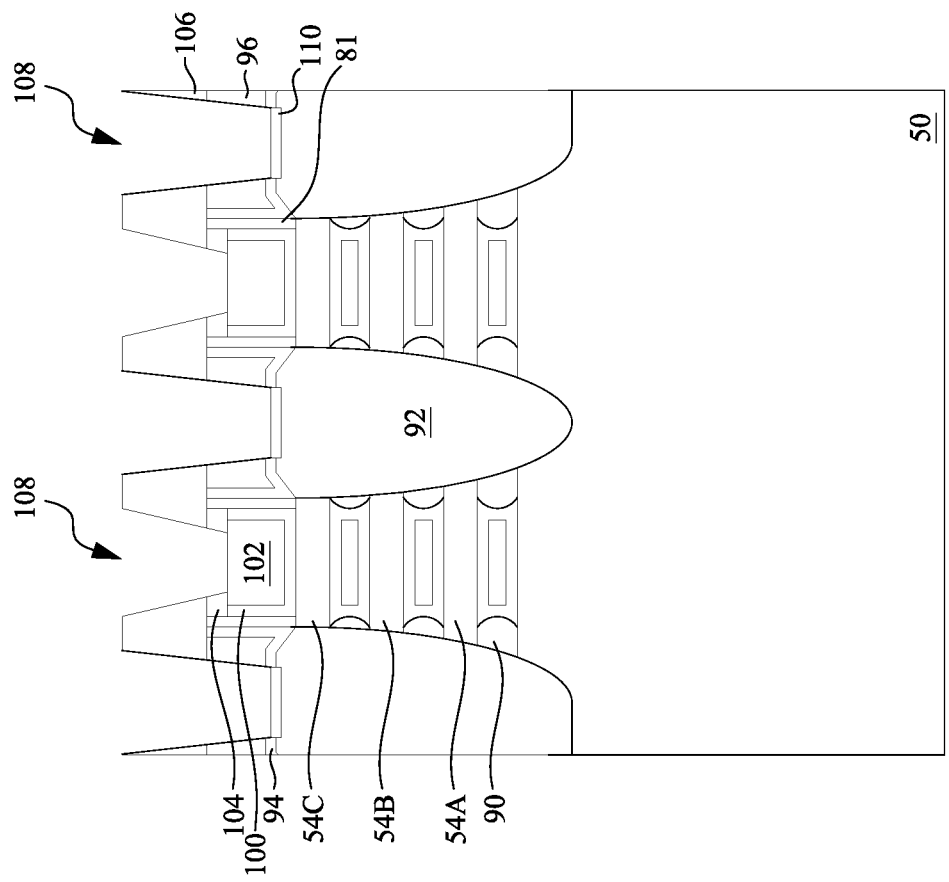
Figure 19A:
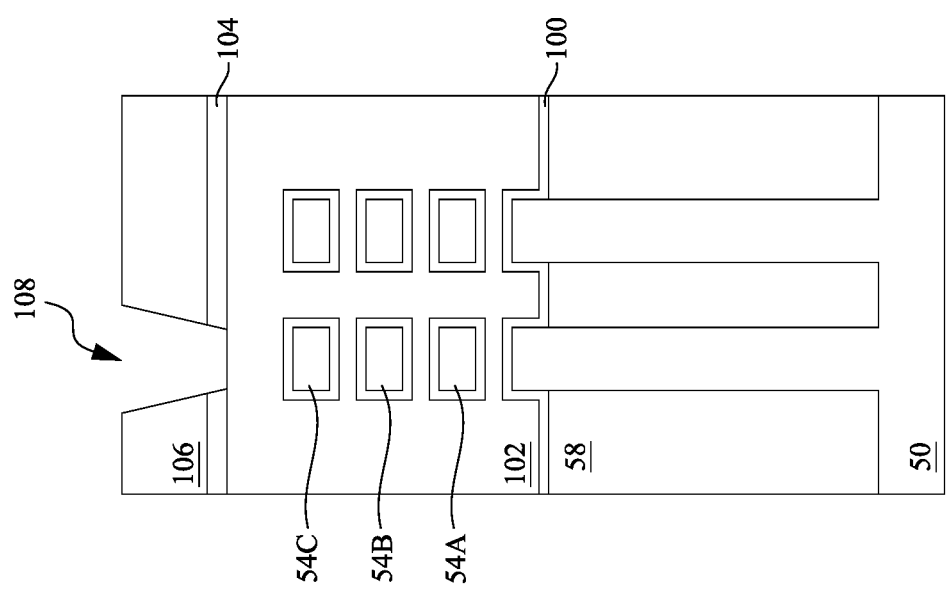
Figure 19C:
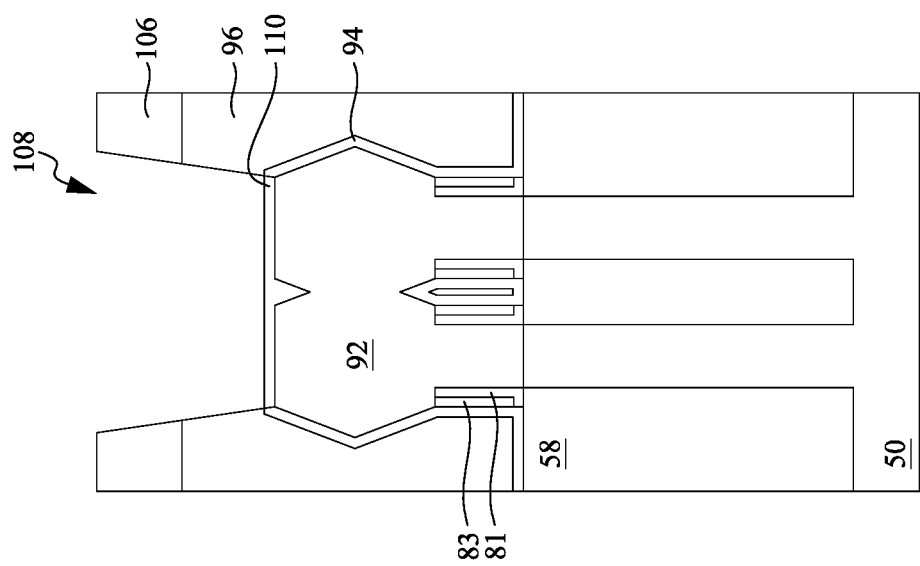

In FIGS. 19A-19C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 19B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 20B:
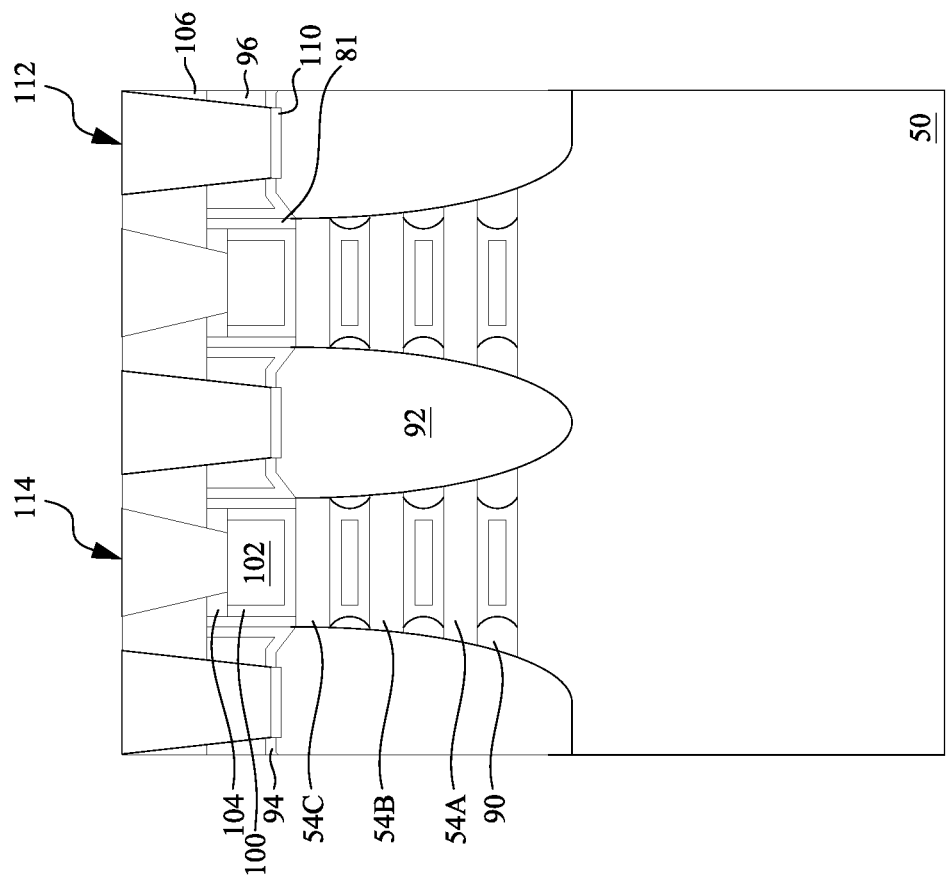
Figure 20A:
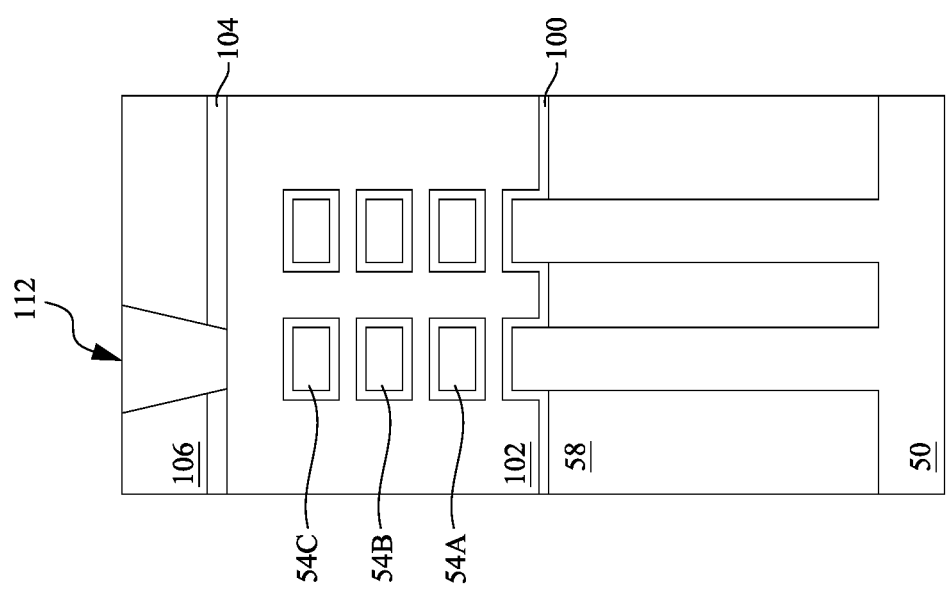
Figure 20C:
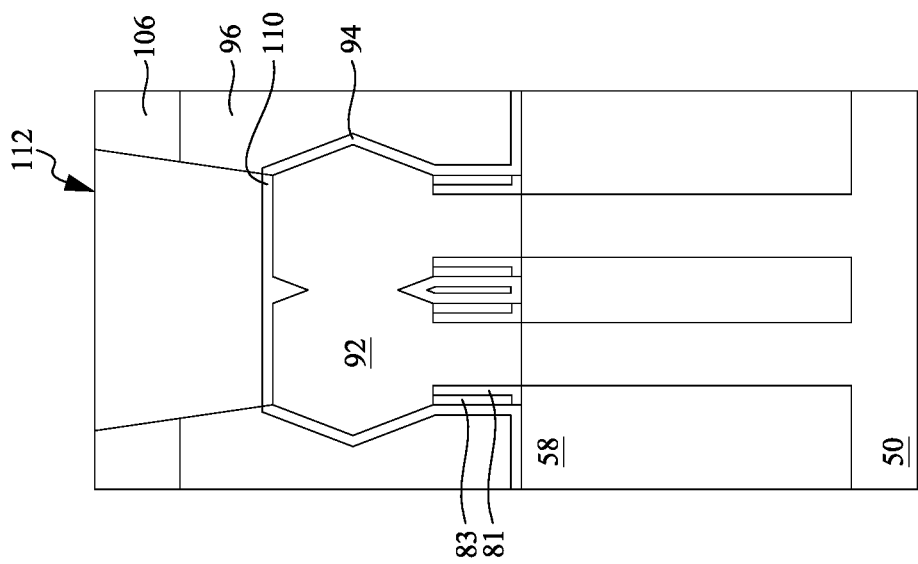

Next, in FIGS. 20A-C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and is electrically coupled to the underlying conductive feature (e.g., gate structure 102 and/or silicide region 110 in the illustrated embodiment). The contacts 114 are electrically coupled to the gate structure 102 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Although FIGS. 20A-C illustrate a contact 112 extending to each of the epitaxial source/drain regions 92, the contact 112 may be omitted from certain ones of the epitaxial source/drain regions 92. For example, as explained in greater detail below, conductive features (e.g., power rails)

may be subsequently attached through a backside of one or more of the epitaxial source/drain regions 92. For these particular epitaxial source/drain regions 92, the source/drain contacts 112 may be omitted or may be a dummy contact that is not electrically connected to any overlying conductive lines.

Various embodiments described herein provide nanoFETs that include gate regions around a stack of channel regions having a relatively uniform gate length. The gate regions of the uniform length may be achieved, for example, by replacing sacrificial nanosheets disposed between the semiconductor nanosheets that subsequently provide the channel regions in the completed transistor. The sacrificial nanosheets may be deposited with varying concentrations of germanium such that each of the sacrificial nanosheets may be etched a different amount to compensate for a non-uniform, anisotropic etching processes used to pattern the sacrificial nanosheets. As a result, the profiles of the sacrificial nanosheets (and resulting gate regions) may be more precisely controlled to provide improved uniformity. Further, defects, such as silicon germanium residue after removal of the sacrificial nanosheets, may be avoided by doping the sacrificial nanosheets with a Group III element (e.g., boron or the like).

In an embodiment, a device includes a first gate region having a first gate length; a first spacer on a sidewall of the first gate region; a semiconductor layer over the first gate region; a second gate region over the semiconductor layer, wherein the second gate region has a second gate length equal to the first gate length; and a second spacer on a sidewall of second gate region, wherein the second spacer is wider than the first spacer. Optionally, in some embodiments, a sidewall of the first gate region facing the first spacer is convex. Optionally, in some embodiments, a sidewall of the first gate region facing the first spacer is concave. Optionally, in some embodiments, a sidewall of the first gate region facing the first spacer is straight. Optionally, in some embodiments, a sidewall of the first spacer opposite the first gate region is flush with a sidewall of the semiconductor layer. Optionally, in some embodiments, a sidewall of the first spacer opposite the first gate region is recessed from a sidewall of the semiconductor layer. Optionally, in some embodiments, the device further includes a source/drain region adjacent the first gate region and the second gate region, wherein the source/drain region extends between the semiconductor layer and a second semiconductor layer, wherein the second semiconductor layer is disposed under the first gate region. Optionally, in some embodiments, the second semiconductor layer is wider than the semiconductor layer.

In an embodiment, a transistor includes a first nanostructure; a second nanostructure over the first nanostructure, wherein the first nanostructure is wider than the second nanostructure; a gate structure around the first nanostructure and the second nanostructure, wherein the gate structure comprises: a first region over the first nanostructure; and a second region over the second nanostructure, wherein the second region has a same gate length as the first region. Optionally, in some embodiments, a first spacer on a sidewall of the first region of the gate structure is wider than a second spacer on a sidewall of the second region of the gate structure. Optionally, in some embodiments, a sidewall of the first spacer is aligned with a sidewall of the first nanostructure. Optionally, in some embodiments, the transistor further includes a source/drain region adjacent the gate structure, wherein the source/drain region extends between the first nanostructure and the second nanostructure In an embodiment, a method includes depositing a first semiconductor layer over a substrate; depositing a second semiconductor layer over the first semiconductor layer; depositing third semiconductor layer over the second semiconductor layer, wherein a germanium concentration of the first semiconductor layer is greater than the third semiconductor layer; etching a first opening through the first semiconductor layer, the second semiconductor layer, and the third semiconductor layer; etching the first semiconductor layer and the third semiconductor layer through the first opening, wherein after etching the first semiconductor layer and the third semiconductor layer, the first semiconductor layer has a same width as the third semiconductor layer; forming a source/drain region in the opening; and replacing the first semiconductor layer and the third semiconductor layer with a gate structure, wherein the gate structure is disposed around the second semiconductor layer. Optionally, in some embodiments, a Group III element dopant concentration of the first semiconductor layer is greater than a Group III element dopant concentration of the third semiconductor layer. Optionally, in some embodiments, the Group III element dopant is boron. Optionally, in some embodiments, recessing the first semiconductor layer and the second semiconductor layer defines a second opening adjacent the first semiconductor layer and a third opening adjacent the third semiconductor layer, wherein the second opening and the third semiconductor layer are connected to the first opening; and wherein the method further comprises: forming a first spacer in the second opening; and forming a second spacer in the third opening. Optionally, in some embodiments, a width of the second spacer is in a range of 1 nm to 3 nm. Optionally, in some embodiments, the second opening is wider than the third opening. Optionally, in some embodiments, a Group III element dopant concentration of the first semiconductor layer is highest at a top surface and a bottom surface of the first semiconductor layer. Optionally, in some embodiments, a Group III element dopant concentration of the first semiconductor layer is highest at an interior of the first semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a first semiconductor layer over a substrate;
   depositing a second semiconductor layer over the first semiconductor layer;
   depositing a third semiconductor layer over the second semiconductor layer, wherein a germanium concentration of the first semiconductor layer is greater than that of the third semiconductor layer;
   doping the first semiconductor layer with boron, wherein a first boron concentration of the first semiconductor layer is non-uniform, wherein the first boron concentration varies along a thickness direction of the first semiconductor layer, wherein the first boron concentration decreases continuously from a first location of the first semiconductor layer to a second location of the first semiconductor layer, remains constant from the second location of the first semiconductor layer to a third location of the first semiconductor layer, and increases continuously from the third location of the first semiconductor layer to a fourth location of the first semiconductor layer, wherein the first location, the second location, the third location, and the fourth location of the first semiconductor layer are aligned along a same line that extends along the thickness direction of the first semiconductor layer;

doping the third semiconductor layer with boron;

etching a first opening through the first semiconductor layer, the second semiconductor layer, and the third semiconductor layer;

recessing the first semiconductor layer and the third semiconductor layer through the first opening, wherein after recessing the first semiconductor layer and the third semiconductor layer, the first semiconductor layer has a same width as the third semiconductor layer;

forming a source/drain region in the first opening; and replacing the first semiconductor layer and the third semiconductor layer with a gate structure, wherein the gate structure is disposed around the second semiconductor layer.

2. The method of claim 1, wherein recessing the first semiconductor layer and the third semiconductor layer defines a second opening adjacent the first semiconductor layer and a third opening adjacent the third semiconductor layer, wherein the second opening and the third semiconductor layer are connected to the first opening; and wherein the method further comprises:

forming a first spacer in the second opening; and forming a second spacer in the third opening.

3. The method of claim 2, wherein the second opening is wider than the third opening.

4. A method comprising:

etching a first source/drain recess extending through a first semiconductor layer, a second semiconductor layer, and a third semiconductor layer, the second semiconductor layer being disposed over the first semiconductor layer, the third semiconductor layer being disposed over the second semiconductor layer, wherein the first semiconductor layer and the third semiconductor layer are doped with a Group III element, wherein the first semiconductor layer has a first dopant concentration of the Group III element that varies along a thickness direction of the first semiconductor layer, wherein the first dopant concentration decreases continuously from a first location of the first semiconductor layer to a second location of the first semiconductor layer, remains constant from the second location of the first semiconductor layer to a third location of the first semiconductor layer, and increases continuously from the third location of the first semiconductor layer to a fourth location of the first semiconductor layer, wherein the first location, the second location, the third location, and the fourth location of the first semiconductor layer are aligned along a same line that extends along the thickness direction of the first semiconductor layer;

etching the first semiconductor layer and the third semiconductor layer through the first source/drain recess using an etchant that etches the first semiconductor layer at a faster rate than the third semiconductor layer;

forming a first dielectric spacer on a sidewall of the first semiconductor layer and a second dielectric spacer on a sidewall of the third semiconductor layer, the first dielectric spacer being wider than the second dielectric spacer in a cross-sectional view, the first and the second dielectric spacers physically contacting the second semiconductor layer;

after forming the first dielectric spacer on the sidewall of the first semiconductor layer and the second dielectric spacer on the sidewall of the third semiconductor layer, epitaxially growing a first source/drain region in the first source/drain recess;

patterning a gate recess, wherein patterning the gate recess comprises removing the first semiconductor layer and the third semiconductor layer; and forming gate stack in the gate recess and surrounding the second semiconductor layer, the gate stack comprising a high-k gate dielectric layer and a gate electrode.

5. The method of claim 4, further comprising:

etching a second source/drain recess extending through the first semiconductor layer, the second semiconductor layer, and the third semiconductor layer, wherein before etching the first semiconductor layer, the second semiconductor layer, and the third semiconductor layer, a portion of the first semiconductor layer between the first source/drain recess and the second source/drain recess is wider than a portion of the third semiconductor layer between the first source/drain recess and the second source/drain recess in the cross-sectional view.

6. The method of claim 5, wherein after etching the first semiconductor layer, the second semiconductor layer, and the third semiconductor layer, the portion of the first semiconductor layer between the first source/drain recess and the second source/drain recess has a same width as the portion of the third semiconductor layer between the first source/drain recess and the second source/drain recess in the cross-sectional view.

7. The method of claim 4, wherein a germanium concentration of the first semiconductor layer is higher than a germanium concentration of the third semiconductor layer.

8. The method of claim 4, wherein a boron concentration of the first semiconductor layer is higher than a boron concentration of the third semiconductor layer.

9. A method comprising:

epitaxially growing a first silicon germanium layer over a substrate;

epitaxially growing a silicon layer over the first silicon germanium layer;

epitaxially growing a second silicon germanium layer over the silicon layer, wherein the first silicon germanium layer has a higher germanium percentage than the second silicon germanium layer;

doping the first silicon germanium layer with boron, wherein a first boron concentration of the first silicon germanium layer is non-uniform, wherein the first boron concentration varies along a thickness direction of the first silicon germanium layer, wherein the first boron concentration decreases continuously from a first location of the first silicon germanium layer to a second location of the first silicon germanium layer, remains constant from the second location of the first silicon germanium layer to a third location of the first silicon germanium layer, and increases continuously from the third location of the first silicon germanium layer to a fourth location of the first silicon germanium layer, wherein the first location, the second location, the third location, and the fourth location of the first silicon germanium layer are aligned along a same line that extends along the thickness direction of the first silicon germanium layer;

doping the second silicon germanium layer with boron, wherein a second boron concentration of the second silicon germanium layer is non-uniform, etching a source/drain recess extending through the second silicon germanium layer, the silicon layer, and the first silicon germanium layer;

recessing a sidewall of the first silicon germanium layer in the source/drain recess and a sidewall of the second silicon germanium layer in the source/drain recess, wherein the sidewall of the first silicon germanium layer is recessed a greater amount than the sidewall of the second silicon germanium layer;

forming a first dielectric spacer on the sidewall of the first silicon germanium layer and a second dielectric spacer on the sidewall of the second silicon germanium layer; and epitaxially growing a source/drain region in the source/drain recess.

10. The method of claim 9, wherein the first dielectric spacer is wider than the second dielectric spacer.

11. The method of claim 1, wherein depositing the first semiconductor layer over the substrate is performed in-situ with doping the first semiconductor layer with boron.

12. The method of claim 4, wherein the gate stack further comprises an interfacial oxide layer between the high-k gate dielectric layer and the third semiconductor layer, the interfacial oxide layer physically contacting the first and the second dielectric spacers.

13. The method of claim 1, wherein a second boron concentration of the third semiconductor layer is non-uniform.

14. The method of claim 1, wherein the first boron concentration of the first semiconductor layer is lowest at a midpoint between a top surface of the first semiconductor layer and a bottom surface of the first semiconductor layer.

15. The method of claim 14, wherein the first boron concentration has a first gradient that decreases from the top surface of the first semiconductor layer toward the midpoint, and has a second gradient that decreases from the bottom surface of the first semiconductor layer toward the midpoint, wherein the first boron concentration is zero at the midpoint.

16. The method of claim 4, wherein the third semiconductor layer has a second dopant concentration of the Group III element that varies along a thickness direction of the third semiconductor layer, wherein the second dopant concentration decreases continuously from a first location of the third semiconductor layer to a second location of the third semiconductor layer, remains constant from the second location of the third semiconductor layer to a third location of the third semiconductor layer, and increases continuously from the third location of the third semiconductor layer to a fourth location of the third semiconductor layer, wherein the first location, the second location, the third location, and the fourth location of the third semiconductor layer are aligned along a same line that extends along the thickness direction of the third semiconductor layer.

17. The method of claim 4, wherein the first dopant concentration increases continuously from a fifth location of the first semiconductor layer to the first location of the first semiconductor layer, and decreases continuously from the fourth location of the first semiconductor layer to a sixth location of the first semiconductor layer, wherein the fifth location and the sixth location are aligned along the same line with the first location, the second location, the third location, and the fourth location.

18. The method of claim 9, wherein a boron concentration of the first silicon germanium layer is greater than a boron concentration of the second silicon germanium layer.

* * * * *